US011527297B2

(12) United States Patent
Fukushima

(10) Patent No.: US 11,527,297 B2
(45) Date of Patent: Dec. 13, 2022

(54) SEMICONDUCTOR DEVICE AND MEMORY ABNORMALITY DETERMINATION SYSTEM

(71) Applicant: ROHM Co., Ltd., Kyoto (JP)

(72) Inventor: Shun Fukushima, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/951,537

(22) Filed: Nov. 18, 2020

(65) Prior Publication Data
US 2021/0158884 A1    May 27, 2021

(30) Foreign Application Priority Data

Nov. 22, 2019    (JP) .............................. JP2019-211341

(51) Int. Cl.
| | |
|---|---|
| *G11C 29/02* | (2006.01) |
| *G11C 29/38* | (2006.01) |
| *G06F 1/26* | (2006.01) |
| *G11C 29/14* | (2006.01) |
| *G11C 29/12* | (2006.01) |
| *G01R 31/74* | (2020.01) |

(52) U.S. Cl.
CPC .............. *G11C 29/027* (2013.01); *G06F 1/26* (2013.01); *G11C 29/12005* (2013.01); *G11C 29/14* (2013.01); *G11C 29/38* (2013.01); *G01R 31/74* (2020.01)

(58) Field of Classification Search
CPC ................................................... G11C 17/143
See application file for complete search history.

(56) References Cited

U.S. PATENT DOCUMENTS

| | | | | |
|---|---|---|---|---|
| 4,730,273 | A * | 3/1988 | Sluss ...................... | G11C 17/18 365/201 |
| 5,206,583 | A * | 4/1993 | Dawson .................. | G11C 29/52 324/73.1 |
| 5,453,696 | A * | 9/1995 | Becker ................... | G11C 29/02 324/550 |
| 6,670,843 | B1 * | 12/2003 | Moench ................. | G11C 17/18 327/525 |
| 6,972,614 | B2 * | 12/2005 | Anderson, II ......... | G11C 17/16 327/525 |
| 7,030,641 | B1 * | 4/2006 | Tang ...................... | G11C 17/16 324/550 |
| 7,474,106 | B2 * | 1/2009 | Kanno .................. | G11C 29/028 324/550 |
| 7,501,879 | B1 * | 3/2009 | Oh ......................... | G11C 17/16 365/225.7 |
| 7,701,226 | B2 * | 4/2010 | Kaneko .................. | G01R 31/74 365/225.7 |

(Continued)

FOREIGN PATENT DOCUMENTS

JP    2010-272825    12/2010

*Primary Examiner* — Steve N Nguyen
(74) *Attorney, Agent, or Firm* — Chip Law Group

(57) ABSTRACT

Disclosed herein is a semiconductor device including a non-volatile memory unit. The non-volatile memory unit has a subject current path disposed in a semiconductor integrated circuit and a fuse element inserted in series on the subject current path, and changes output data according to a voltage between both ends of the fuse element when supply of a subject current to the subject current path is intended. A current supply part that switches the subject current between a plurality of stages is disposed in the non-volatile memory unit.

11 Claims, 12 Drawing Sheets

(56) References Cited

U.S. PATENT DOCUMENTS

| | | | | |
|---|---|---|---|---|
| 7,936,582 B1* | 5/2011 | Zhou | ................ | G11C 7/04 |
| | | | | 365/96 |
| 8,098,074 B2* | 1/2012 | Do | ................ | G11C 29/027 |
| | | | | 361/104 |
| 2006/0268485 A1* | 11/2006 | Yanagida | ............ | G11C 29/027 |
| | | | | 361/104 |
| 2008/0265907 A1* | 10/2008 | Wienchol | ............... | G11C 17/18 |
| | | | | 324/550 |
| 2016/0077146 A1* | 3/2016 | Englekirk | .............. | G01R 31/74 |
| | | | | 324/550 |
| 2018/0366183 A1* | 12/2018 | Tu | ................ | G11C 29/787 |

\* cited by examiner

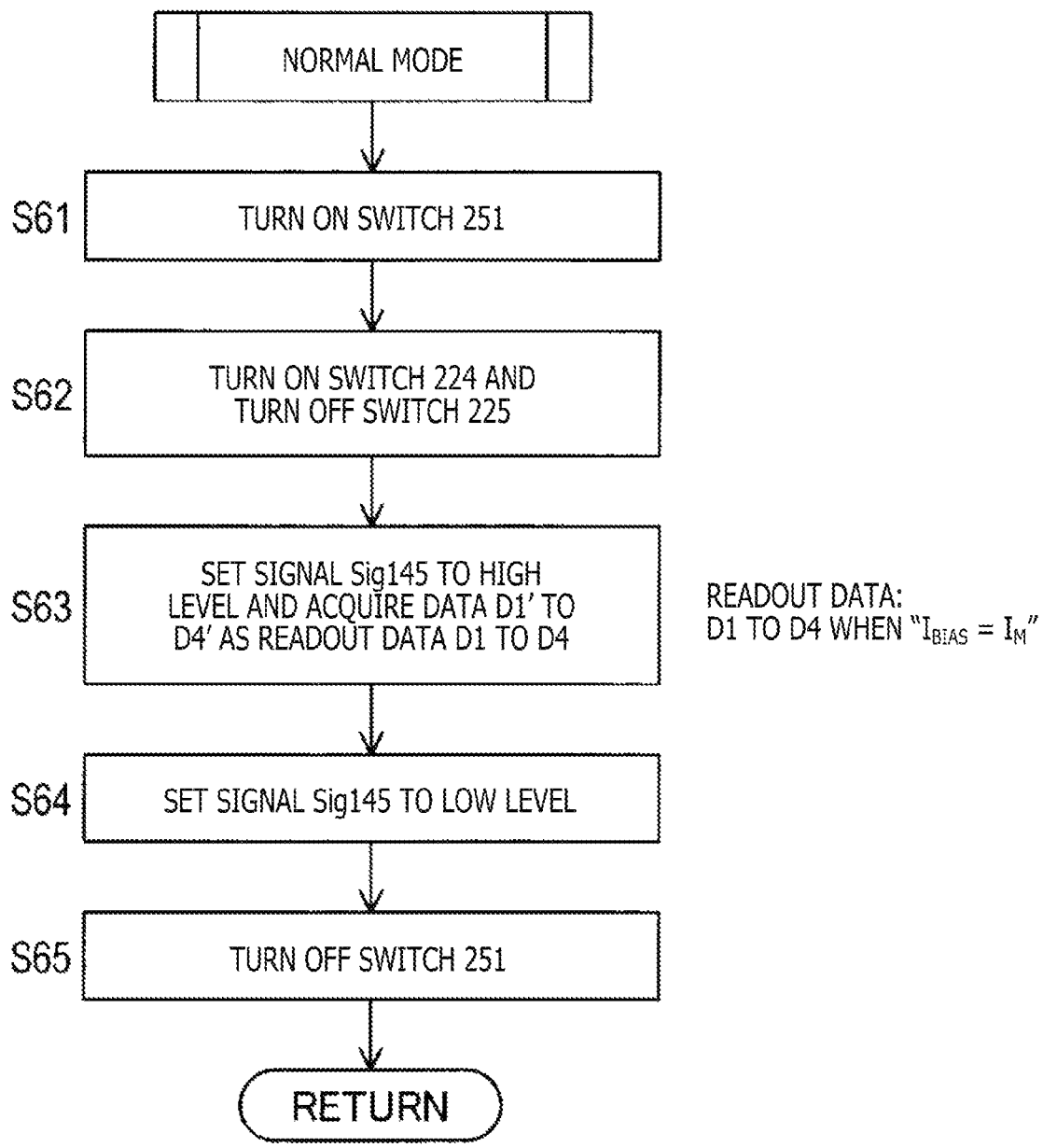

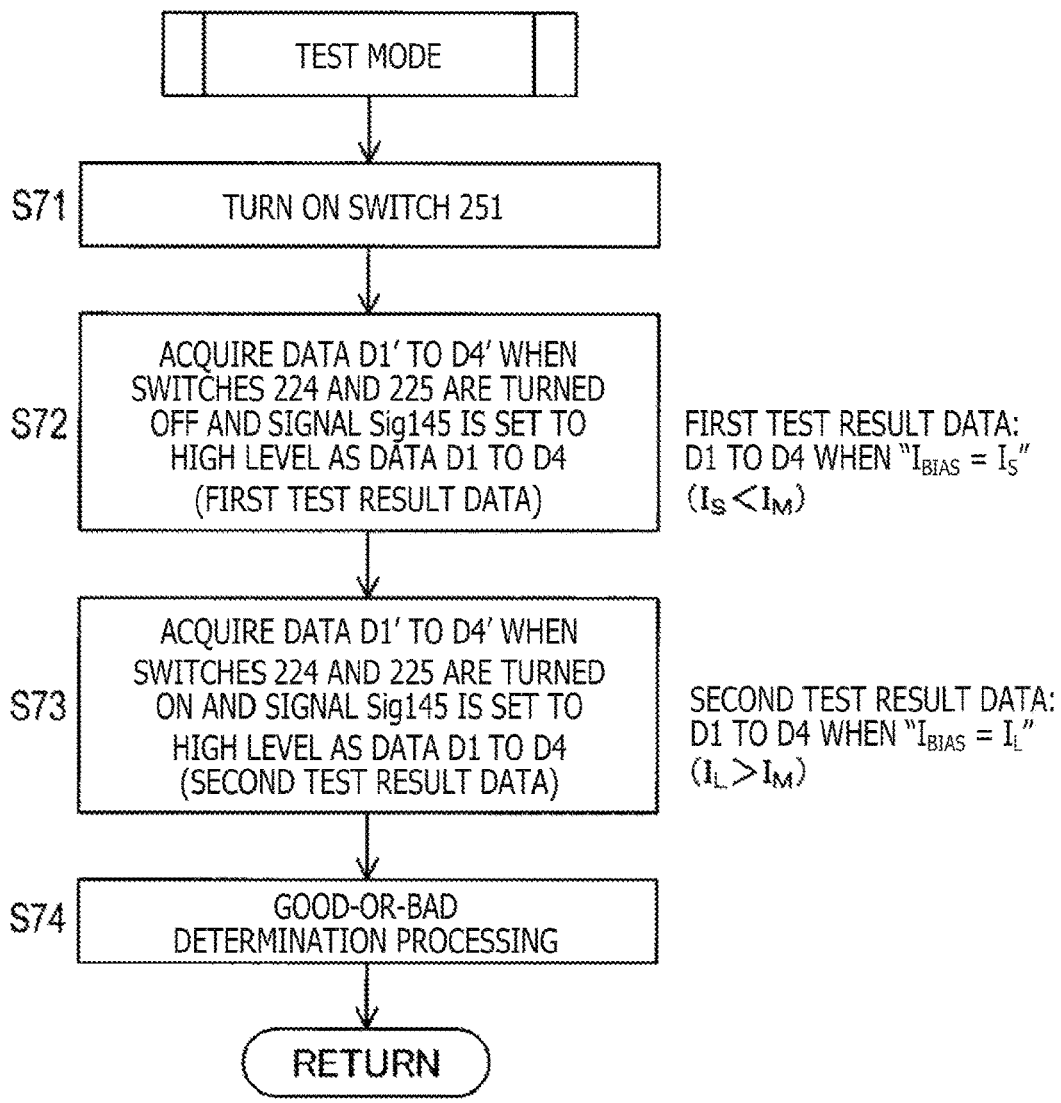
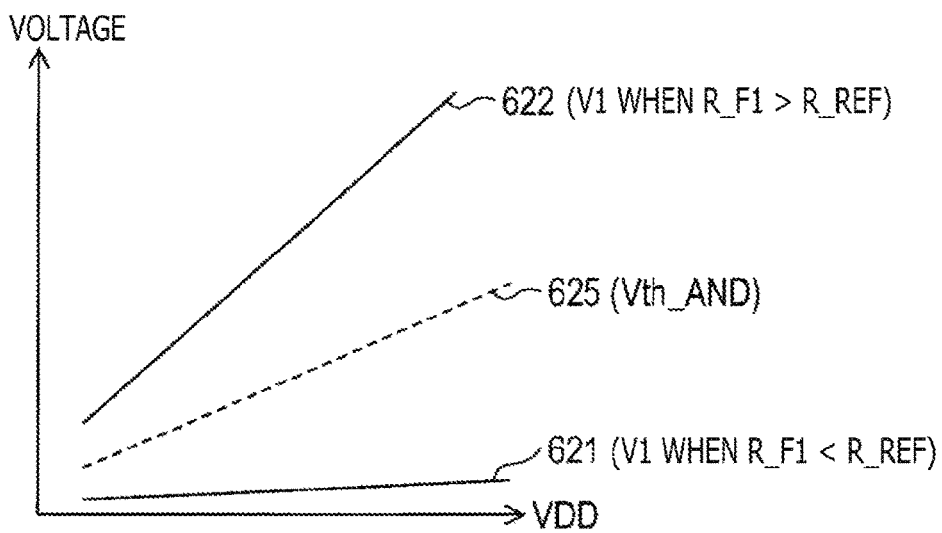

SEMICONDUCTOR DEVICE AND MEMORY ABNORMALITY DETERMINATION SYSTEM

CROSS REFERENCE TO RELATED APPLICATIONS

This application claims priority benefit of Japanese Patent Application No. JP 2019-211341 filed in the Japan Patent Office on Nov. 22, 2019. Each of the above-referenced applications is hereby incorporated herein by reference in its entirety.

BACKGROUND

The present disclosure relates to a semiconductor device and a memory abnormality determination system.

In FIG. 17, a configuration of a non-volatile memory unit 900 according to a reference technique is illustrated. The non-volatile memory unit 900 is a read only memory (ROM) that includes a plurality of fuse elements that can be physically cut, and in which stored data is set according to whether or not each fuse element has been cut.

In the non-volatile memory unit 900, four current paths are connected to an output side of a current mirror circuit 910 and fuse elements F901 to F904 are inserted in the four current paths one by one in series. Each fuse element can be cut by energization with a large current or laser irradiation in a manufacturing step of the non-volatile memory unit 900. When stored data of the non-volatile memory unit 900 is read out, a bias current $I_{BIAS}$ generated by a constant current source 920 is caused to flow on an input side of the current mirror circuit 910, and a voltage between both ends of each fuse element at this time is read out by a data output part 940. The data output part 940 includes four AND circuits corresponding to the fuse elements F901 to F904. The AND circuits are used in order to take out data only when cutting/non-cutting information of the fuse elements F901 to F904 is necessary.

For example, when the fuse element F901 has been cut, a voltage of a connecting node between the current mirror circuit 910 and one end of the fuse element F901 becomes a high level, and a value (logical value) of "1" is read out by the data output part 940. When the fuse element F901 has not been cut, the voltage of the connecting node between the current mirror circuit 910 and the one end of the fuse element F901 becomes a low level, and a value (logical value) of "0" is read out by the data output part 940. This applies also to the fuse elements F902 to F904, and data of 4 bits can be stored in the non-volatile memory unit 900 of FIG. 17.

An example of the related art is disclosed in Japanese Patent Laid-open No. 2010-272825.

SUMMARY

In a semiconductor device including the non-volatile memory unit 900, it is ideal that a resistance between both ends of the fuse element F901 becomes sufficiently high when laser irradiation or other processing for cutting the fuse element F901 is carried out and the resistance between both ends of the fuse element F901 is sufficiently low if this is not the case.

However, even when the laser irradiation or other processing for cutting the fuse element F901 is carried out in a manufacturing process of the semiconductor device including the non-volatile memory unit 900, ideal cutting of the fuse element F901 is not implemented, and the fuse element F901 has comparatively-low residual resistance (for example, resistance of approximately 100 kΩ) compared with when the fuse element F901 is ideally cut, in some cases. This applies also to the fuse elements F902 to F904.

There is a possibility that the value (logical value) of data read out by the data output part 940 is inverted from an original value (output logical inversion) due to such residual resistance. If output logical inversion is detected at the stage of shipping inspection of the semiconductor device including the non-volatile memory unit 900, it suffices that this semiconductor device is excluded from the target of shipping as a defective product. However, in some cases, output logical inversion is not found at the stage of shipping inspection and the semiconductor device is shipped as a good product, but thereafter output logical inversion occurs due to an influence of temperature or aging.

The semiconductor device that involves the possibility of the occurrence of output logical inversion due to the influence of temperature or aging should be excluded in terms of improvement in reliability of the non-volatile memory unit, and it is desired to develop a configuration that can detect whether or not the possibility of the occurrence of output logical inversion exists.

It is desirable to provide a semiconductor device and a memory abnormality determination system that contribute to improvement in reliability of a non-volatile memory unit by a fuse element.

A semiconductor device according to an embodiment of the present disclosure has the following configuration (first configuration). The semiconductor device includes a non-volatile memory unit that has a subject current path disposed in a semiconductor integrated circuit and a fuse element inserted in series on the subject current path and changes output data according to a voltage between both ends of the fuse element when supply of a subject current to the subject current path is intended. A current supply part that switches the subject current between a plurality of stages is disposed in the non-volatile memory unit.

In the semiconductor device according to the above-described first configuration, the following configuration (second configuration) may be employed. The semiconductor device is capable of operation in a test mode or a normal mode. A functional circuit unit that carries out operation according to the output data in the normal mode is disposed in the semiconductor device. The current supply part sets a value of the subject current to a reference current value in the normal mode and sets the value of the subject current with switching between a plurality of test current values in the test mode. The plurality of test current values include a first test current value smaller than the reference current value and a second test current value larger than the reference current value.

In the semiconductor device according to the above-described second configuration, the following configuration (third configuration) may be employed. First test result data that is the output data when the value of the subject current is set to the first test current value and second test result data that is the output data when the value of the subject current is set to the second test current value are used for determination of whether or not an abnormality of the fuse element exists.

In the semiconductor device according to any of the above-described first to third configurations, the following configuration (fourth configuration) may be employed. The current supply part has a variable current source capable of switching a bias current that flows in a predetermined reference current path between a plurality of stages, and a current mirror circuit that is connected to the reference current path and the target current path and operates to cause a current in proportion to the bias current to flow in the subject current path as the subject current. The subject current is switched between the plurality of stages by switching the bias current between the plurality of stages.

In the semiconductor device according to any of the above-described first to third configurations, the following configuration (fifth configuration) may be employed. The current supply part has a reference transistor that is a field effect transistor inserted in series on a predetermined reference current path, a fuse-side transistor that is a field effect transistor inserted in series on the subject current path, and a bias voltage supply part that supplies a common bias voltage to each gate of the reference transistor and the fuse-side transistor. The current supply part further has a current mirror circuit that is connected to the reference current path and the target current path and operates to cause a current in proportion to a bias current that flows in the reference current path to flow in the subject current path as the subject current, and a variable resistance part disposed between a source of the reference transistor and an electrically-conductive part having a predetermined reference potential. The bias current that flows in the reference current path is switched between a plurality of stages by switching a resistance value of the variable resistance part between a plurality of stages, to switch the subject current to be supplied to the subject current path between the plurality of stages. The fuse element is disposed between a source of the fuse-side transistor and the electrically-conductive part.

In the semiconductor device according to the above-described fifth configuration, the following configuration (sixth configuration) may be employed. A ratio of a channel width to a channel length in the reference transistor and a ratio of a channel width to a channel length in the fuse-side transistor are set identical to each other.

In the semiconductor device according to any of the above-described first to sixth configurations, the following configuration (seventh configuration) may be employed. The non-volatile memory unit has a plurality of sets of the subject current path and the fuse element and outputs output data of a plurality of bits.

A memory abnormality determination system according to another embodiment of the present disclosure has the following configuration (eighth configuration). The memory abnormality determination system includes the semiconductor device according to the above-described third configuration and a determining device that determines whether or not an abnormality of the fuse element exists on the basis of the first test result data and the second test result data.

In the memory abnormality determination system according to the above-described eighth configuration, the following configuration (ninth configuration) may be employed. The determining device determines whether or not an abnormality of the fuse element exists on the basis of comparison between the first test result data and the second test result data or on the basis of comparison between first information according to the first test result data and second information according to the second test result data.

In the semiconductor device according to the above-described third configuration, the following configuration (tenth configuration) may be employed. The semiconductor device further includes a determining circuit that determines whether or not an abnormality of the fuse element exists on the basis of the first test result data and the second test result data.

In the semiconductor device according to the above-described tenth configuration, the following configuration (eleventh configuration) may be employed. The determining circuit determines whether or not an abnormality of the fuse element exists on the basis of comparison between the first test result data and the second test result data or on the basis of comparison between first information according to the first test result data and second information according to the second test result data.

According to the embodiments of the present disclosure, it becomes possible to provide a semiconductor device and a memory abnormality determination system that contribute to improvement in reliability of a non-volatile memory unit by a fuse element.

BRIEF DESCRIPTION OF THE DRAWINGS

FIG. 9 relates to the second embodiment of the present disclosure and is an operation flowchart of the non-volatile memory unit in a normal mode;

FIG. 10 relates to the second embodiment of the present disclosure and is an operation flowchart of the non-volatile memory unit in a test mode;

FIG. 11 relates to the second embodiment of the present disclosure and is a diagram illustrating a relation between several voltages and a supply voltage that relate to the non-volatile memory unit;

DETAILED DESCRIPTION OF THE PREFERRED EMBODIMENTS

Figure 1:
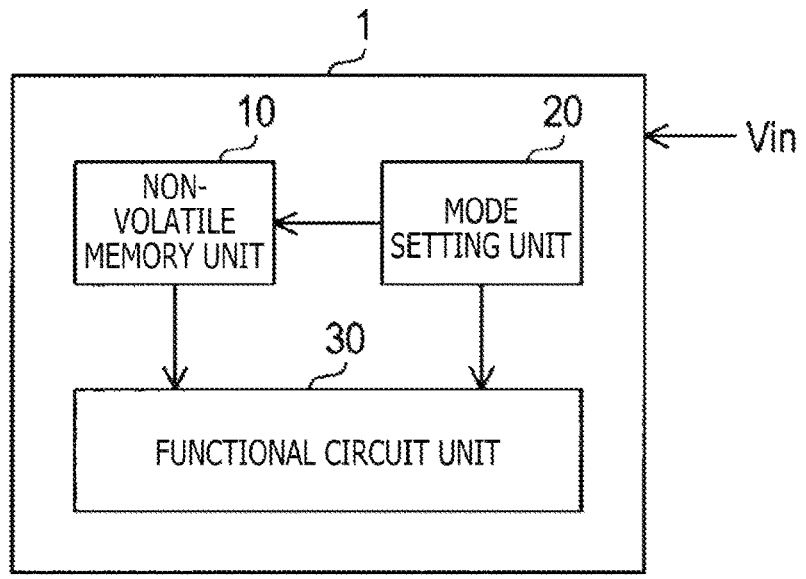
FIG. 1 is a schematic configuration block diagram of a semiconductor device according to a first embodiment of the present disclosure.

Examples of embodiments of the present disclosure will be specifically described below with reference to the drawings. In the respective diagrams to which reference is made, the same part is given the same numeral and overlapping description relating to the same part is omitted in principle. In the present specification, for simplification of description, by depicting a symbol or numeral for reference to information, signal, physical quantity, element, or part, for example, the name of the information, signal, physical quantity, element, or part corresponding to this symbol or numeral is omitted or abbreviated in some cases. For example, a non-volatile memory unit 100 (see FIG. 4) referenced with "100" to be described later is represented as the non-volatile memory unit 100 in some cases and is possibly abbreviated as the memory unit 100 in other cases, and they all refer to the same thing.

First, explanation will be made regarding several terms used in the description of embodiments of the present disclosure. The IC is an abbreviation for an integrated circuit. The ground refers to an electrically-conductive part having a potential of 0 V (zero volt) as a basis or refers to the potential itself of 0 V. The potential of 0 V is sometimes referred to as the ground potential. In the embodiments of the present disclosure, a voltage indicated without particularly setting a basis represents a potential from the viewpoint of the ground.

The level refers to the level of the potential, and the high level has a potential higher than the low level regarding any signal or voltage. Regarding any signal or voltage, that the signal or voltage is at the high level means that the level of the signal or voltage is at the high level, and that the signal or voltage is at the low level means that the level of the signal or voltage is at the low level. The level in terms of a signal is expressed as the signal level in some cases, and the level in terms of a voltage is expressed as the voltage level in some cases.

Regarding any transistor configured as a field effect transistor (FET) including a MOSFET, the on-state refers to that a channel between a drain and a source of the transistor is in a conductive state, and the off-state refers to that the channel between the drain and the source of the transistor is in a non-conductive state (cut-off state). This applies also to transistors that are not classified as the FET. The MOSFET may be interpreted as an enhancement MOSFET as long as a particular description is not made. The MOSFET is an abbreviation for "metal-oxide-semiconductor field-effect transistor."

Any switch can be configured with one or more FETs. A path between both ends of a certain switch becomes conductive when this switch is in the on-state, whereas a path between both ends of a switch becomes non-conductive when this switch is in the off-state. Hereinafter, regarding any transistor or switch, the on-state and the off-state are expressed simply as ON and OFF in some cases.

First Embodiment

Figure 2:
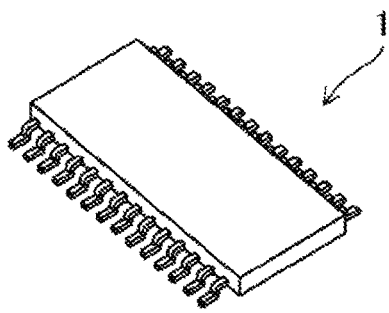
FIG. 2 is an appearance perspective view of the semiconductor device according to the first embodiment of the present disclosure.

A first embodiment of the present disclosure will be described. FIG. 1 is a schematic configuration block diagram of a semiconductor device 1 according to the first embodiment of the present disclosure. The semiconductor device 1 includes a non-volatile memory unit 10, a mode setting unit 20, and a functional circuit unit 30. The non-volatile memory unit 10, the mode setting unit 20, and the functional circuit unit 30 are configured as a semiconductor integrated circuit. FIG. 2 is an appearance perspective view of the semiconductor device 1. The semiconductor device 1 is an electronic component formed by enclosing the semiconductor integrated circuit in a casing (package) formed of a resin. A plurality of external terminals are disposed on the casing of the semiconductor device 1 in an exposed manner. The number of external terminals of the semiconductor device 1 and the appearance of the semiconductor device 1 illustrated in FIG. 2 are merely exemplification.

A positive direct-current input voltage Vin is supplied from an external voltage source that is not illustrated in the diagram to the semiconductor device 1. The semiconductor device 1 is driven by using the input voltage Vin.

The non-volatile memory unit 10 is a storing circuit that can store data of n bits in a non-volatile manner and output stored data. n is any integer equal to or larger than 1. The non-volatile memory unit 10 is a ROM that includes n fuse elements that can be physically cut, and in which stored data is set according to whether or not each fuse element has been cut.

Figure 3:
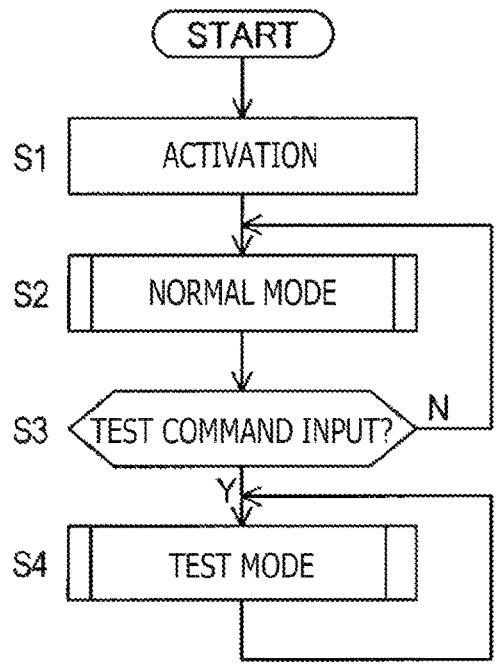
FIG. 3 is a schematic operation flowchart of the semiconductor device according to the first embodiment of the present disclosure.

The mode setting unit 20 sets an operation mode of the semiconductor device 1 to any of a plurality of modes. The above-described plurality of modes include a normal mode and a test mode. The test mode is a mode used in pre-shipping inspection of the semiconductor device 1. As illustrated in FIG. 3, the semiconductor device 1 operates in the normal mode in principle and the operation mode of the semiconductor device 1 is set to the normal mode at the time of activation of the semiconductor device 1 (steps S1 and S2). Only when a predetermined test command is input from an external device that is not illustrated in the diagram to the semiconductor device 1 (Y of step S3), the operation mode of the semiconductor device 1 is set to the test mode by the mode setting unit 20 and each circuit in the semiconductor device 1 operates in the test mode (step S4). After the setting to the test mode, supply of the input voltage Vin to the semiconductor device 1 is interrupted. Thereafter, when the supply of the input voltage Vin to the semiconductor device 1 is resumed, the operation mode of the semiconductor device 1 becomes the normal mode. A mode other than the normal mode and the test mode may be included in the above-described plurality of modes. In the following, focus will be made only on the normal mode and the test mode. Details of operation in the normal mode and the test mode will be described later.

The functional circuit unit 30 carries out predetermined operation according to output data of the non-volatile memory unit 10 in the normal mode. For example, when including a reference voltage generating circuit (not illustrated) that generates a reference voltage, the functional circuit unit 30 adjusts and sets this reference voltage (value of the reference voltage) according to output data of the non-volatile memory unit 10. Alternatively, for example, when including a signal generating circuit (not illustrated) that generates a signal with a certain frequency, the functional circuit unit 30 adjusts and sets this frequency (value of the frequency) according to output data of the non-volatile memory unit 10. These adjustments may be what is generally referred to as trimming. The trimming is carried out for the purpose of causing the value of the reference voltage or other values to correspond with or approximate a desired value. The semiconductor device 1 operates as various devices depending on the configuration of the functional circuit unit 30. The semiconductor device 1 may be a control device for a power supply circuit or may be a motor driver or a light emitting diode (LED) driver.

Figure 4:
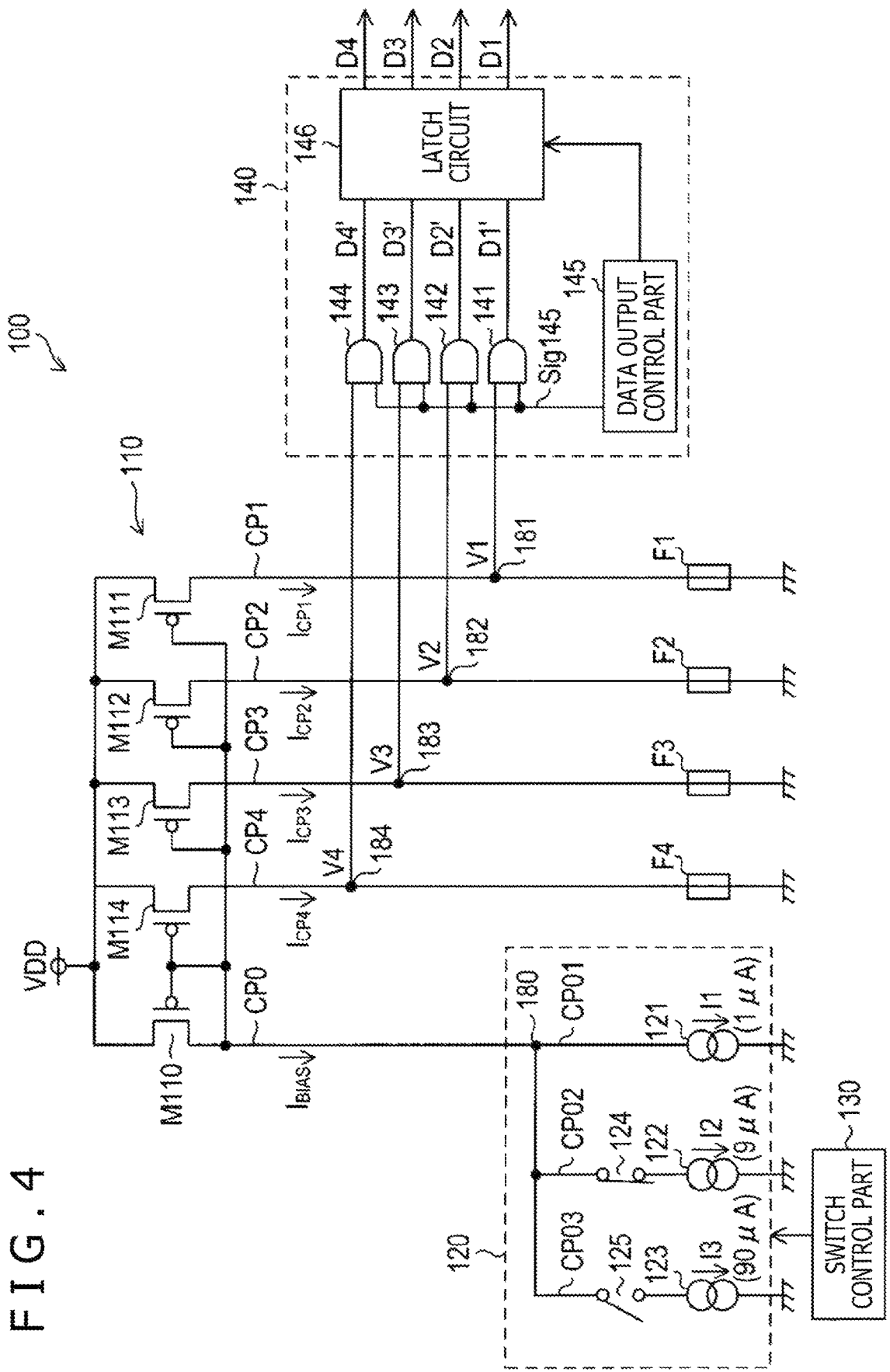
FIG. 4 is a configuration diagram of a non-volatile memory unit according to the first embodiment of the present disclosure.

In FIG. 4, an internal configuration of a non-volatile memory unit 100 that can be used as the non-volatile memory unit 10 is illustrated. Hereinafter, suppose that the non-volatile memory unit 100 of FIG. 4 is used as the non-volatile memory unit 10 in the first embodiment. In the non-volatile memory unit 100 of FIG. 4, data of 4 bits is stored in a non-volatile manner (i.e., "n=4").

The non-volatile memory unit 100 is a memory unit formed in a semiconductor integrated circuit and includes five current paths CP0 to CP4, four fuse elements F1 to F4, a current mirror circuit 110, a variable current source 120, a switch control part 130, and a data output part 140.

The current mirror circuit 110 includes transistors M110 to M114 each configured as a P-channel MOSFET. In the current mirror circuit 110, the transistor M110 is disposed on an input side of current and the transistors M111 to M114 are disposed on an output side of current. Specifically, respective sources of the transistors M110 to M114 are connected to an application terminal of a supply voltage VDD (i.e., terminal to which the supply voltage VDD is applied) and respective gates of the transistors M110 to M114 are connected to each other in common. Furthermore, the gate and a drain are connected to each other in the transistor M110. Drains of the transistors M110 to M114 are connected to the respective current paths CP0 to CP4 that are five isolated interconnect lines.

The supply voltage VDD is a positive direct-current voltage generated on the basis of the input voltage Vin by an internal power supply circuit (not illustrated) disposed in the semiconductor device 1. However, the supply voltage VDD may be the input voltage Vin itself.

The variable current source 120 includes constant current sources 121 to 123 and switches 124 and 125. The current path CP0 that extends from the drain of the transistor M110 branches into three current paths CP01 to CP03 at a node 180 to reach the ground. The current paths CP01 to CP03 are three interconnect lines between the node 180 and the ground. The constant current source 121 is inserted in series on the current path CP01. The constant current source 122 and the switch 124 are inserted in series on the current path CP02. The constant current source 123 and the switch 125 are inserted in series on the current path CP03.

The constant current sources 121 and 123 operate based on the supply voltage VDD. The constant current source 121 causes a constant current I1 to flow from the node 180 toward the ground through the current path CP01. The constant current source 122 causes a constant current I2 to flow from the node 180 toward the ground through the current path CP02 when the switch 124 is in the on-state. When the switch 124 is in the off-state, the constant current I2 does not flow in the current path CP02. The constant current source 123 causes a constant current I3 to flow from the node 180 toward the ground through the current path CP03 when the switch 125 is in the on-state. When the switch 125 is in the off-state, the constant current I3 does not flow in the current path CP03.

The switch control part 130 controls the on/off-state of the switches 124 and 125 individually. The switch control part 130 may be interpreted as a part included in the constituent elements of the variable current source 120. A current that flows from the drain of the transistor M110 toward the ground in the current path CP0 is referred to as a bias current and is referenced with symbol "$I_{BIAS}$."

In the memory unit 100, the bias current $I_{BIAS}$ changes according to the on/off-state of the switches 124 and 125. Therefore, it can be said that the variable current source 120 is a current source that supplies the variable bias current $I_{BIAS}$ to the input side of the current mirror circuit 110. Specifically, the bias current $I_{BIAS}$ corresponds with the constant current I1 when the switches 124 and 125 are both in the off-state, and corresponds with the sum of the constant currents I1, I2, and I3 when the switches 124 and 125 are both in the on-state. The bias current $I_{BIAS}$ corresponds with the sum of the constant currents I1 and I2 when the switches 124 and 125 are in the on-state and the off-state, respectively, and corresponds with the sum of the constant currents I1 and I3 when the switches 124 and 125 are in the off-state and the on-state, respectively.

Here, the constant current sources 121 to 123 are configured in such a manner that a relation of "I1<I2<I3" is satisfied. That is, the constant current I2 is larger than the constant current I1, and the constant current I3 is larger than the constant current I2. For example, the constant current I2 has magnitude that is approximately ten times the constant current I1, and the constant current I3 has magnitude that is approximately ten times the constant current I2. Here, as an example, suppose that the constant currents I1, I2, and I3 are set to 1 microampere (μA), 9 μA, and 90 μA, respectively.

The drain of the transistor M111 is connected to a first end of the fuse element F1 through the current path CP1, and a second end of the fuse element F1 is connected to the ground. That is, the fuse element F1 is inserted in series on the current path CP1 of the drain current of the transistor M111. A connecting node between the drain of the transistor M111 and the first end of the fuse element F1, which is a node on the current path CP1, is referred to as a node 181. Furthermore, a voltage at the node 181 is referred to as a voltage V1.

The drain of the transistor M112 is connected to a first end of the fuse element F2 through the current path CP2, and a second end of the fuse element F2 is connected to the ground. That is, the fuse element F2 is inserted in series on the current path CP2 of the drain current of the transistor M112. A connecting node between the drain of the transistor M112 and the first end of the fuse element F2, which is a node on the current path CP2, is referred to as a node 182. Furthermore, a voltage at the node 182 is referred to as a voltage V2.

The drain of the transistor M113 is connected to a first end of the fuse element F3 through the current path CP3, and a second end of the fuse element F3 is connected to the ground. That is, the fuse element F3 is inserted in series on the current path CP3 of the drain current of the transistor M113. A connecting node between the drain of the transistor M113 and the first end of the fuse element F3, which is a node on the current path CP3, is referred to as a node 183. Furthermore, a voltage at the node 183 is referred to as a voltage V3.

The drain of the transistor M114 is connected to a first end of the fuse element F4 through the current path CP4, and a second end of the fuse element F4 is connected to the ground. That is, the fuse element F4 is inserted in series on the current path CP4 of the drain current of the transistor M114. A connecting node between the drain of the transistor M114 and the first end of the fuse element F4, which is a node on the current path CP4, is referred to as a node 184. Furthermore, a voltage at the node 184 is referred to as a voltage V4.

The drain current of the transistor M111 (i.e., current that flows in the current path CP1) is represented by symbol "$I_{CP1}$." The drain current of the transistor M112 (i.e., current that flows in the current path CP2) is represented by symbol "$I_{CP2}$." The drain current of the transistor M113 (i.e., current that flows in the current path CP3) is represented by symbol "$I_{CP3}$." The drain current of the transistor M114 (i.e., current that flows in the current path CP4) is represented by symbol "$I_{CP4}$."

The fuse elements F1 to F4 are elements that include polysilicon, a metal, or other materials and can be physically cut by energization with a large current or laser irradiation. The fuse elements F1 to F4 are individually cut or are not cut in the manufacturing process of the semiconductor device 1.

If the fuse element F1 has not been cut and a resistance between both ends of the fuse element F1 is sufficiently low, the current $I_{CP1}$ has a current value in proportion to the bias current $I_{BIAS}$. Similarly, if the fuse element F2 has not been cut and a resistance between both ends of the fuse element F2 is sufficiently low, the current $I_{CP2}$ has a current value in proportion to the bias current $I_{BIAS}$. This applies also to the currents $I_{CP3}$ and $I_{CP4}$. As above, the current mirror circuit 110 operates to cause currents in proportion to the bias current $I_{BIAS}$ that flows in the current path CP0 to flow in the current paths CP1 to CP4 as the currents $I_{CP1}$ to $I_{CP4}$. However, when the fuse element F1 has been cut and the resistance between both ends of the fuse element F1 is sufficiently high, the current in proportion to the bias current $I_{BIAS}$ does not flow in the current path CP1. This applies also to the current paths CP2 to CP4.

The data output part 140 includes AND circuits 141 to 144, a data output control part 145, and a latch circuit 146. Each of the AND circuits 141 to 144 is a two-input logical product circuit having first and second input terminals and an output terminal. The two-input logical product circuit outputs a logical product signal of input signals to the first and second input terminals from the output terminal. Each output signal of the AND circuits 141 to 144 is a binary signal that takes a signal level of the low level or the high level and has a value (logical value) of "0" or "1." Here, suppose that a value (logical value) of "0" is allocated to the output signal at the low level from the AND circuit and a value (logical value) of "1" is allocated to the output signal at the high level from the AND circuit. Hereinafter, data represented by the output signals of the AND circuits 141 to 144 are referred to as data D1', D2', D3', and D4', respectively. The data D1' has the value of the output signal of the AND circuit 141. That is, the data D1' has a value of "0" when the output signal of the AND circuit 141 is at the low level, and the data D1' has a value of "1" when the output signal of the AND circuit 141 is at the high level. This applies also to the output data D2' to D4'.

The first input terminals of the AND circuits 141 to 144 are connected to the nodes 181 to 184, respectively, and receive input of the voltages V1 to V4. A signal Sig145 from the data output control part 145 is input to the second input terminals of the AND circuits 141 to 144 in common.

The data output control part 145 supplies the signal Sig145 at the low level or the high level to the respective second input terminals of the AND circuits 141 to 144. Only when the signal Sig145 is at the high level, the AND circuits 141 to 144 output the significant data D1' to D4' according to the voltages V1 to V4, respectively. The data D1' to D4' when the signal Sig145 is at the low level are invalid.

Under control by the data output control part 145, the latch circuit 146 latches (i.e., takes in and holds) the data D1' to D4' when the signal Sig145 is at the high level and outputs the latched data as data D1 to D4. Therefore, the data D1 has a value of "0" if the voltage V1 has a voltage value classified into the low level in the AND circuit 141, and the data D1 has a value of "1" if the voltage V1 has a voltage value classified into the high level in the AND circuit 141. Similarly, the data D2 has a value of "0" if the voltage V2 has a voltage value classified into the low level in the AND circuit 142, and the data D2 has a value of "1" if the voltage V2 has a voltage value classified into the high level in the AND circuit 142. This applies also to the data D3 corresponding to the voltage V3 and the data D4 corresponding to the voltage V4.

The respective circuits in the data output part 140, including the AND circuits 141 to 144, operate by using the supply voltage VDD as a drive voltage. The high level in the signal Sig145 is substantially equal to the level of the supply voltage VDD, and the low level in the signal Sig145 is substantially equal to the level of the ground.

When the voltage V1 is higher than a threshold voltage in the AND circuit 141, the voltage V1 is classified into the high level in the AND circuit 141. When the voltage V1 is lower than the threshold voltage in the AND circuit 141, the voltage V1 is classified into the low level in the AND circuit 141. Similarly, when the voltage V2 is higher than a threshold voltage in the AND circuit 142, the voltage V2 is classified into the high level in the AND circuit 142. When the voltage V2 is lower than the threshold voltage in the AND circuit 142, the voltage V2 is classified into the low level in the AND circuit 142. This applies also to the AND circuits 143 and 144. Each threshold voltage in the AND circuits 141 to 144 depends on the supply voltage VDD and is equivalent to half of the supply voltage VDD, for example.

Figure 5:
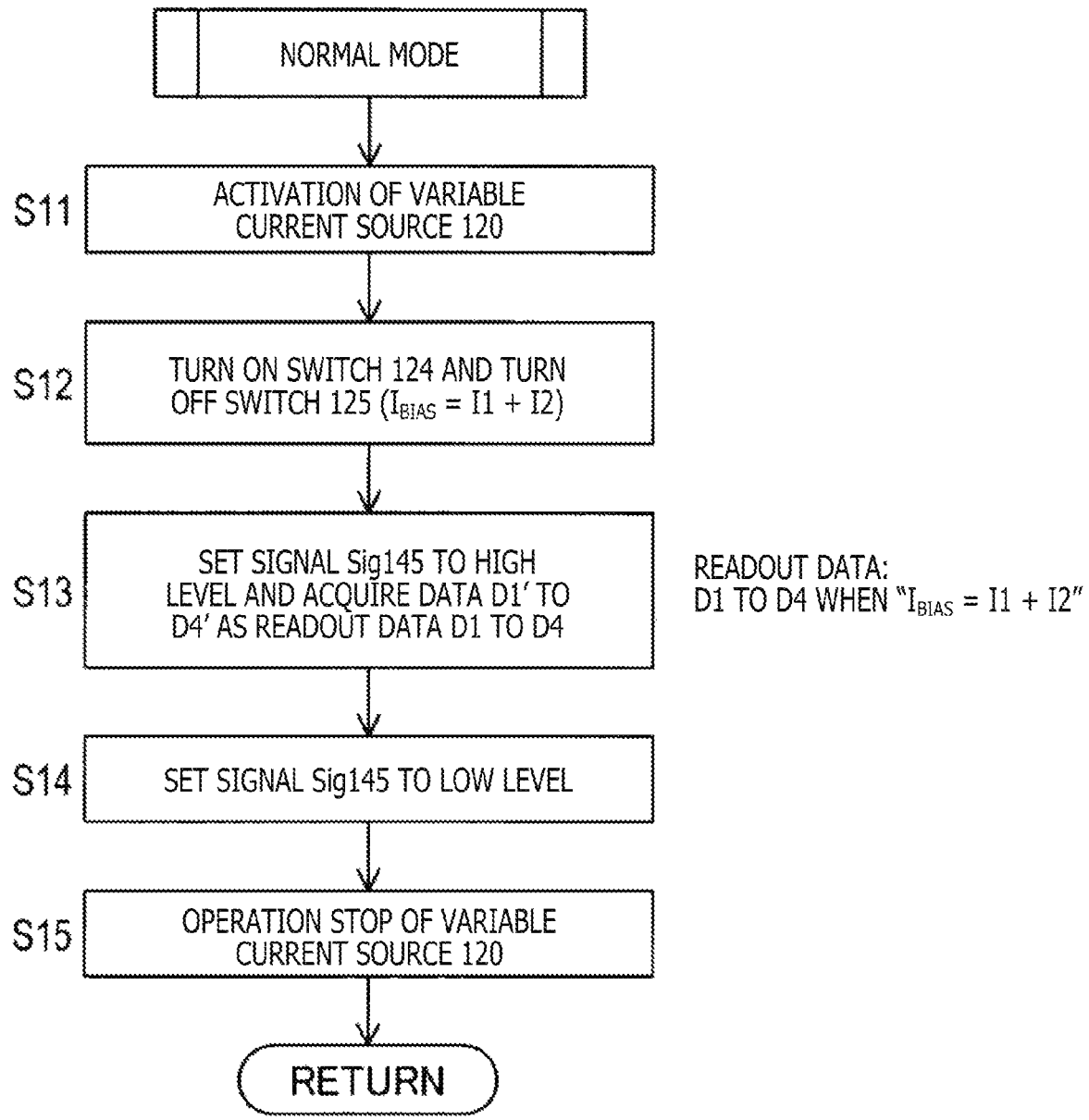
FIG. 5 relates to the first embodiment of the present disclosure and is an operation flowchart of the non-volatile memory unit in a normal mode.

FIG. 5 is an operation flowchart of the memory unit 100 in the normal mode. In the normal mode, first, the variable current source 120 is activated in a step S11. In a subsequent step S12, the switch 124 is set to the on-state and the switch 125 is set to the off-state by the switch control part 130. That is, "$I_{BIAS}=I1+I2$" is set (with the above-described numerical value example, the bias current $I_{BIAS}$ becomes 10 μA). In a subsequent step S13, the signal Sig145 is set to the high level, and the data D1' to D4' when the signal Sig145 is set to the high level are latched and acquired in the latch circuit 146.

As above, in the normal mode, the data D1' to D4' according to the voltages V1 to V4 when "$I_{BIAS}=I1+I2$" is satisfied become the output data D1 to D4 (hereinafter, possibly referred to as readout data). That is, the data D1' to D4' according to the voltages V1 to V4 when supply of reference currents ($I_{CP1}$ to $I_{CP4}$) in proportion to the current (I1+I2) to the current paths CP1 to CP4 is intended are acquired as the readout data D1 to D4. After the data D1' to D4' are acquired as the readout data D1 to D4 according to the voltages V1 to V4 when "$I_{BIAS}=I1+I2$" is satisfied, the signal Sig145 is set to the low level in a step S14. Furthermore, the operation of the variable current source 120 is stopped in a step S15. Due to the operation stop of the variable current source 120, the operation of the constant current sources 121 to 123 stops and the bias current $I_{BIAS}$ becomes zero, so that the unnecessary circuit current is reduced.

The readout data D1 to D4 acquired in the normal mode in the memory unit 100 are supplied to the functional circuit unit 30 (see FIG. 1) as data of 4 bits stored in the memory unit 100.

The output data D1 to D4 become "0" or "1" according to the cut/non-cut state of the fuse elements F1 to F4. When the fuse element F1 is ideally cut in the manufacturing process of the semiconductor device 1, the resistance between both ends of the fuse element F1 becomes sufficiently high. Therefore, the voltage V1 becomes sufficiently high and the readout data D1 becomes "1" in the step S13. When cutting processing of the fuse element F1 is not executed in the manufacturing process of the semiconductor device 1, the resistance between both ends of the fuse element F1 is sufficiently low. Therefore, the voltage V1 becomes sufficiently low and the readout data D1 becomes "0" in the step S13. This applies also to the fuse elements F2 to F4 and the data corresponding to the fuse elements F2 to F4.

However, even when laser irradiation or other processing for cutting the fuse element F1 is carried out in the manufacturing process of the semiconductor device 1, ideal cutting of the fuse element F1 is not implemented, and the fuse element F1 has comparatively-low residual resistance (for example, resistance of approximately 100 kΩ), compared with when ideal cutting is carried out, in some cases. Alternatively, although laser irradiation or other processing should have not been carried out for the fuse element F1, the residual resistance of the fuse element F1 becomes considerably high relative to an expected value (substantially 0Ω) due to any trouble. When such residual resistance exists, there is a possibility that the value of the readout data D1 in the normal mode is inverted from the original value (hereinafter, this inversion is referred to as output logical inversion). Even if the value of the readout data D1 is correct under a certain condition, output logical inversion occurs under another condition due to the influence of temperature or aging in some cases. This applies also to the fuse elements F2 to F4.

Figure 6:
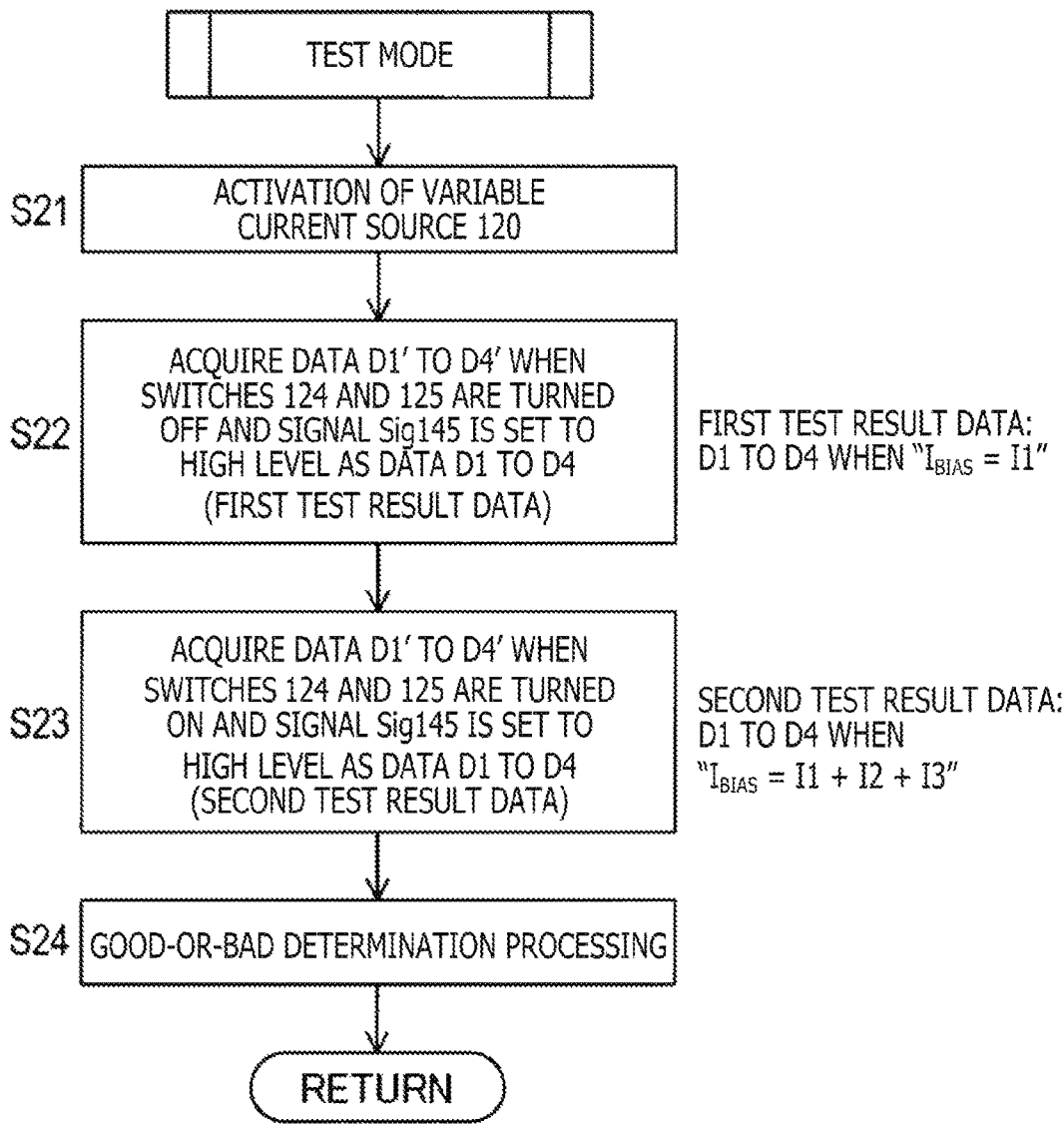
FIG. 6 relates to the first embodiment of the present disclosure and is an operation flowchart of the non-volatile memory unit in a test mode.

A configuration for excluding the semiconductor device 1 in which such output logical inversion is likely to occur as a defective product at the stage of shipping inspection is incorporated in the semiconductor device 1, and the configuration significantly functions in the test mode. FIG. 6 is an operation flowchart of the memory unit 100 in the test mode. However, good-or-bad determination processing of a step S24 in FIG. 6 is executed outside the memory unit 100.

In the test mode, first, the variable current source 120 is activated in a step S21. In a subsequent step S22, the switches 124 and 125 are both set to the off-state by the switch control part 130. Thereafter, the signal Sig145 is set to the high level by the data output control part 145, and the data D1' to D4' at the time are latched by the latch circuit 146 to thereby acquire the data D1 to D4. The data D1 to D4 acquired in the step S22, i.e., the output data D1 to D4 according to the voltages V1 to V4 when "$I_{BIAS}=I1$" is satisfied, function as first test result data. As above, the data D1 to D4 according to the voltages V1 to V4 when supply of first test currents ($I_{CP1}$ to $I_{CP4}$) in proportion to the current I1 to the current paths CP1 to CP4 is intended are acquired as the first test result data. The first test currents are smaller than the above-described reference currents.

In a subsequent step S23, the switches 124 and 125 are both set to the on-state by the switch control part 130. Thereafter, the signal Sig145 is set to the high level by the data output control part 145, and the data D1' to D4' at the time are latched by the latch circuit 146 to thereby acquire the data D1 to D4. The data D1 to D4 acquired in the step S23, i.e., the output data D1 to D4 according to the voltages V1 to V4 when "$I_{BIAS}=I1+I2+I3$" is satisfied, function as second test result data. As above, the data D1 to D4 according to the voltages V1 to V4 when supply of second test currents ($I_{CP1}$ to $I_{CP4}$) in proportion to the current (I1+I2+I3) to the current paths CP1 to CP4 is intended are acquired as the second test result data. The second test currents are larger than the above-described reference currents.

Thereafter, in the step S24, the good-or-bad determination processing based on the first test result data and the second test result data is executed. In the good-or-bad determination processing, whether or not the storing state of data by the memory unit 100 is good is determined. In the good-or-bad determination processing, that it is determined that the storing state of data by the memory unit 100 is good is referred to as good-product determination, and that it is determined that the storing state of data by the memory unit 100 is not good is referred to as defectiveness determination. The semiconductor device 1 regarding which the good-product determination is made in the good-or-bad determination processing is determined as a good product to become a target of shipping. However, the semiconductor device 1 regarding which the defectiveness determination is made in the good-or-bad determination processing is determined as a defective product not to become a target of shipping.

In the good-or-bad determination processing, consistency between the first test result data and the second test result data is evaluated. The good-product determination is made only when the first and second test result data correspond with each other, and the defectiveness determination is made when the first and second test result data do not correspond with each other. That the first and second test result data correspond with each other means that the data D1 to D4 of 4 bits forming the first test result data completely correspond with the data D1 to D4 of 4 bits forming the second test result data. When a difference exists even in 1 bit, it is determined that the first and second test result data do not correspond with each other.

As described above, in the normal mode, stored data of the memory unit 100 is read out in the state of "$I_{BIAS}=I1+I2$." Meanwhile, that there is no difference between the data D1 to D4 in the state of "$I_{BIAS}=I1$" (first test result data) and the data D1 to D4 in the state of "$I_{BIAS}=I1+I2+I3$" (second test result data) means that there is no change in the data D1 to D4 in a range in which "$I1 \leq I_{BIAS} \leq I1+I2+I3$" is satisfied (with the above-described numerical value example, range in which the bias current $I_{BIAS}$ is at least 1 µA and at most 100 µA).

Thus, in the semiconductor device 1 regarding which the good-product determination has been made, it is expected that the correct data D1 to D4 are read out from the memory unit 100 stably in the normal mode even when a certain degree of temperature change or aging occurs.

That the defectiveness determination is made means that output logical inversion occurs at any point in the range in which "$I1 \leq I_{BIAS} \leq I1+I2+I3$" is satisfied, and means that the fuse element is abnormal. The abnormality of the fuse element refers to that the fuse element has an abnormal residual resistance value. An expected value of the residual resistance value of the fuse element has an extremely-large value (value may be interpreted as infinity in theory) if processing of cutting this fuse element has been executed, and has an extremely-small value (value may be interpreted as 0Ω in theory) if processing of cutting this fuse element has not been executed. When having a halfway residual resistance value (for example, 100 kΩ) greatly different from such an expected value, the fuse element is abnormal. It is also possible to think as follows. When the residual resistance value of the fuse element (resistance value between both terminals of the fuse element) belongs to within a predetermined abnormal range, the fuse element is abnormal. When the residual resistance value is outside the predetermined abnormal range, the fuse element is normal. The abnormal range is a resistance value range from 1 kΩ to 1 MΩ, both inclusive, for example.

When the semiconductor device 1 regarding which the defectiveness determination is made is operated in the normal mode, there is a possibility that the semiconductor device 1 is affected by temperature change or aging and output logical inversion occurs or does not occur depending on the case. Due to the good-or-bad determination processing, it becomes possible to exclude the semiconductor device 1 involving a possibility of the occurrence of output logical inversion from the target of shipping as a defective product. Therefore, the occurrence of output logical inversion in the market can be suppressed. As a result, reliability of the semiconductor device 1 (reliability of the semiconductor device 1 brought to the market) can be enhanced.

The above flow can be carried out not only at the time of shipping inspection but also as a self-test after shipping to detect the occurrence of breakdown previously. For example, suppose that a semiconductor device is mounted on a system like a car controlled by a microcomputer. Furthermore, for example, in a system that reads data of a memory at the time of activation of the semiconductor device, after the flow of the steps S21 to S24 in FIG. 6 is carried out at the time of the activation, the semiconductor device is activated in the normal mode, and a flag can be simultaneously output to the microcomputer if an abnormality exists. The flag may be a signal of CMOS output or open drain output. In a semiconductor device including a serial interface, the flow of FIG. 6 is carried out by inputting the test mode from the outside, and information regarding an abnormal place is stored in a register if an abnormality exists. Then, the register is read by the serial interface again and thereby the abnormal place can be identified.

Supply voltage dependence is comparatively large in the memory unit 100 of FIG. 4. A description will be made regarding this. The supply voltage dependence described below similarly applies also to the configuration of FIG. 17.

Figure 7:
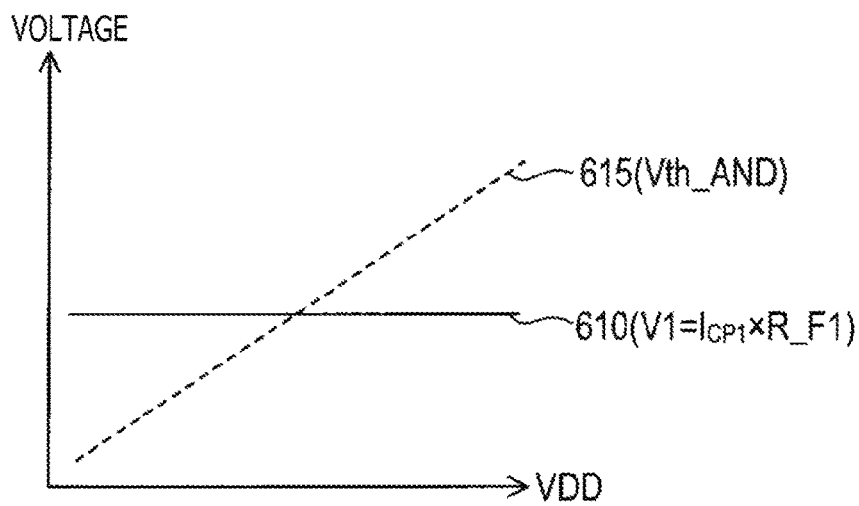
FIG. 7 relates to the first embodiment of the present disclosure and is a diagram illustrating a relation between several voltages and a supply voltage that relate to the non-volatile memory unit.

In FIG. 7, a relation between several voltages and the supply voltage VDD in the memory unit 100 is illustrated. In FIG. 7, a full line segment 610 represents a relation between the voltage V1 and the supply voltage VDD, and a dashed line segment 615 represents a relation between a threshold voltage Vth_AND and the supply voltage VDD in the AND circuit 141. When the current $I_{CP1}$ that is not zero flows in the fuse element F1, the voltage V1 is represented by a product of the current $I_{CP1}$ and a residual resistance R_F1 of the fuse element F1 and does not depend on the supply voltage VDD. On the other hand, the threshold voltage Vth_AND is in proportion to the supply voltage VDD and therefore increases and decreases in association with increase and decrease in the supply voltage VDD. For this reason, when the residual resistance R_F1 has a halfway value, there is a possibility that output logical inversion occurs or does not occur depending on the supply voltage VDD. The same applies also to the AND circuits 142 to 144. Furthermore, the bias current $I_{BIAS}$ also has temperature dependence and supply voltage dependence. Thus, it is also possible that ensuring high reliability with few test items becomes not easy.

Figure 17:
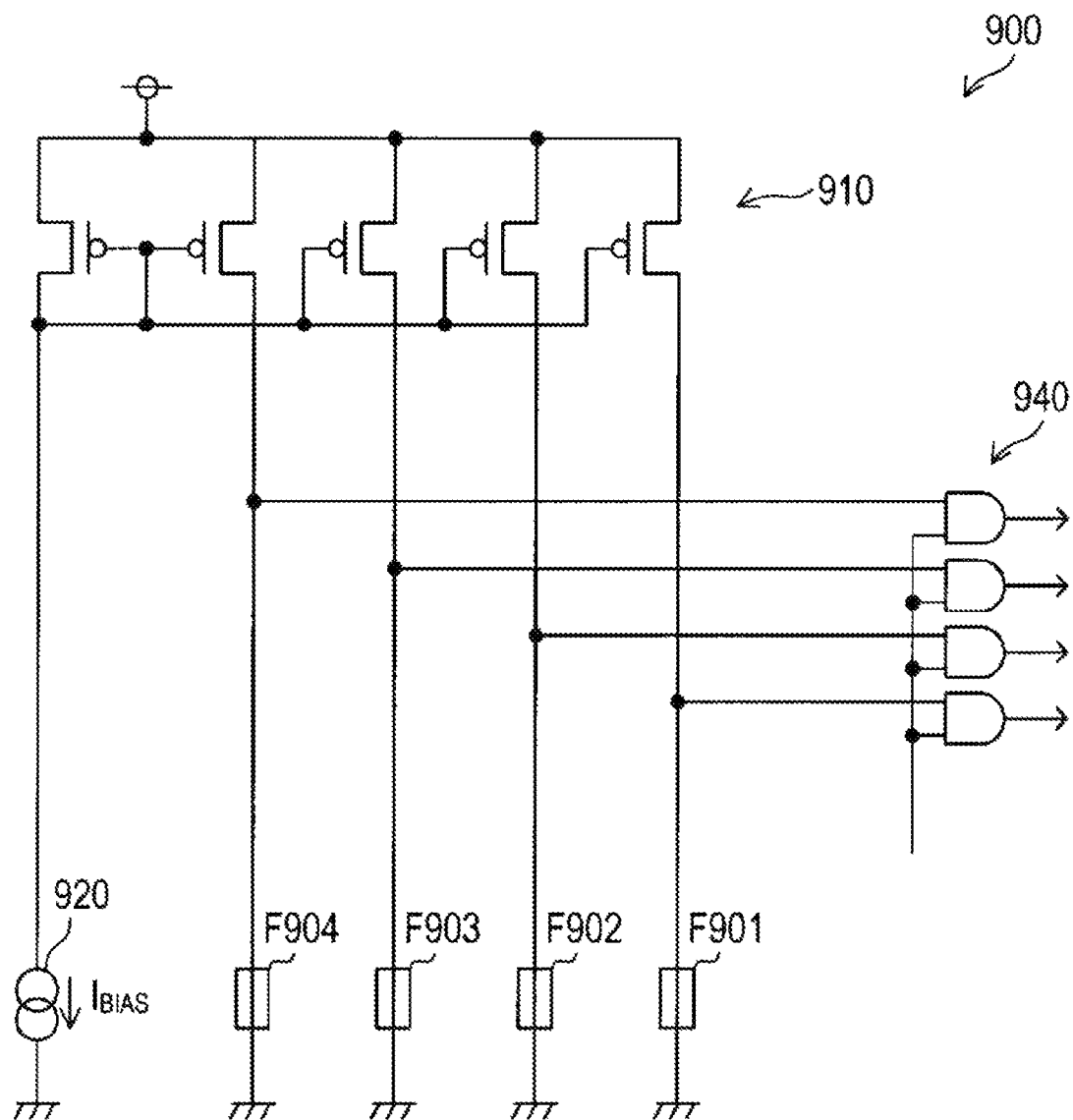
FIG. 17 is a configuration diagram of a non-volatile memory unit according to a reference technique.

Nonetheless, the fact remains that the suppression effect of output logical inversion is high even with the memory unit 100 of FIG. 4 compared with the configuration of FIG. 17. Sufficiently-high reliability is obtained even with the memory unit 100 of FIG. 4 in the case in which sufficient stability of the supply voltage VDD can be expected (case in which the value of the supply voltage VDD can be deemed to be invariable substantially). Furthermore, although high reliability is obtained also by setting a ratio between the constant currents I1 and I2 and a ratio between the constant currents I2 and I3 sufficiently high in consideration of an assumed variation width of the supply voltage VDD and so forth, a configuration that is useful for alleviation of the supply voltage dependence and so forth will be described in a second embodiment to be described later.

Second Embodiment

The second embodiment of the present disclosure will be described. The second embodiment and third to fifth embodiments to be described later are embodiments based on the first embodiment. Regarding matters that are not particularly described in the second to fifth embodiments, description of the first embodiment is applied also to the second to fifth embodiments as long as contradiction does not exist. In interpretation of description of the second embodiment, priority may be given to the description of the second embodiment regarding a matter that contradicts between the first and second embodiments (this applies also to the third to fifth embodiments to be described later). As long as contradiction does not exist, any plural embodiments in the first to fifth embodiments may be combined.

Figure 8:
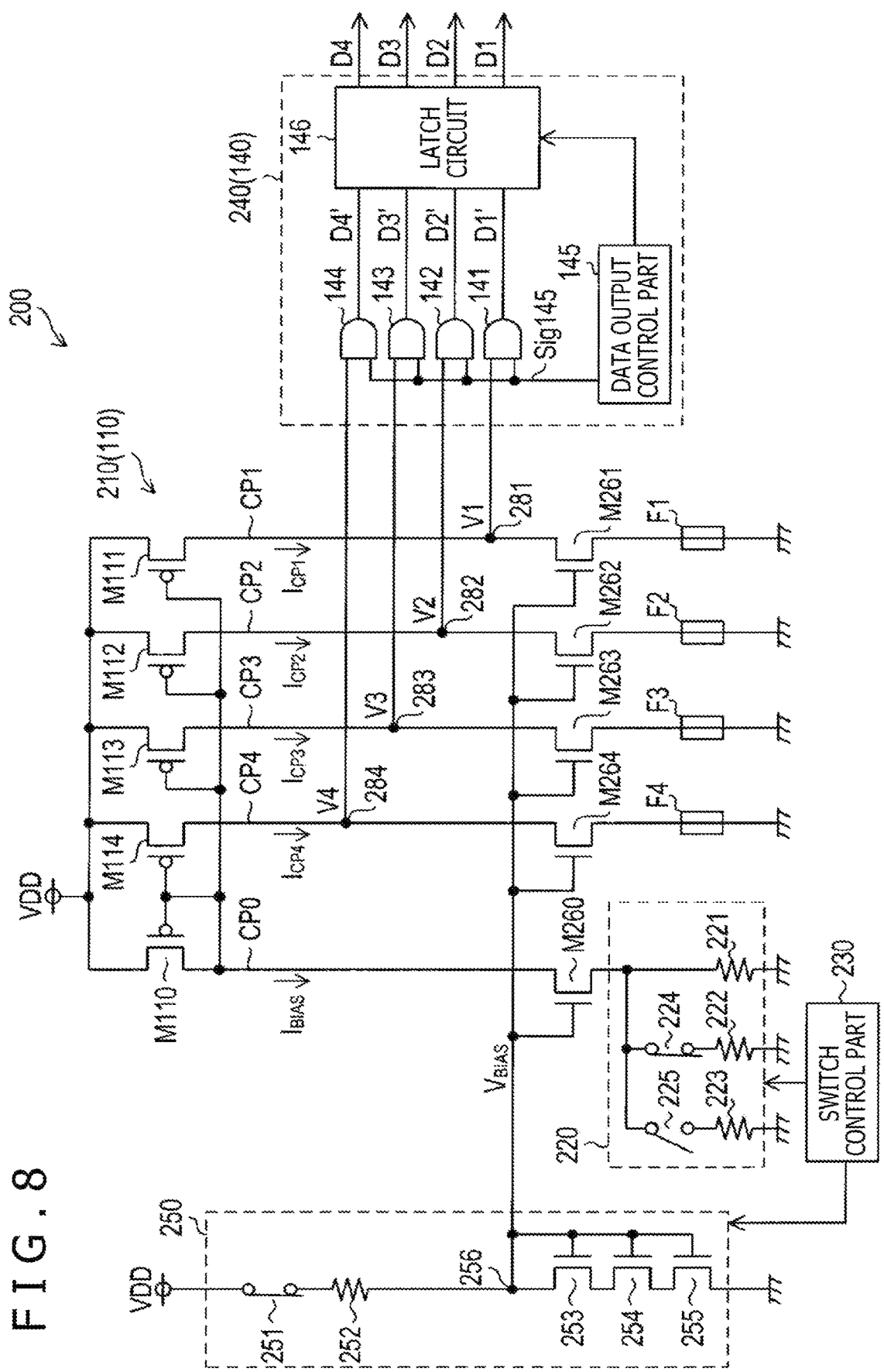
FIG. 8 is a configuration diagram of a non-volatile memory unit according to a second embodiment of the present disclosure.

In FIG. 8, an internal configuration of a non-volatile memory unit 200 that can be used as the non-volatile memory unit 10 in FIG. 1 is illustrated. Suppose that the non-volatile memory unit 200 of FIG. 8 is used as the non-volatile memory unit 10 in the second embodiment. In the non-volatile memory unit 200 of FIG. 8, data of 4 bits is stored in a non-volatile manner (i.e., "n=4").

The non-volatile memory unit 200 is a memory unit formed in a semiconductor integrated circuit and includes five current paths CP0 to CP4, four fuse elements F1 to F4, a current mirror circuit 210, a variable resistance part 220, a switch control part 230, a data output part 240, a bias voltage supply part 250, and transistors M260 to M264. The transistors M260 to M264 are configured as N-channel MOSFETs.

The current mirror circuit 210 has the same configuration as the current mirror circuit 110 in FIG. 4 and therefore includes transistors M110 to M114 each configured as a P-channel MOSFET. In the current mirror circuit 210, the transistor M110 is disposed on an input side of current and the transistors M111 to M114 are disposed on an output side of current. Specifically, respective sources of the transistors M110 to M114 are connected to an application terminal of the supply voltage VDD (i.e., terminal to which the supply voltage VDD is applied), and respective gates of the transistors M110 to M114 are connected to each other in common. Furthermore, the gate and a drain are connected to each other in the transistor M110. Drains of the transistors M110 to M114 are connected to the respective current paths CP0 to CP4 that are five isolated interconnect lines.

In the memory unit 200, the transistor M260 and the variable resistance part 220 are inserted in series on the current path CP0 of the drain current of the transistor M110. Specifically, the drain of the transistor M110 is connected to a drain of the transistor M260 through the current path CP0, and a source of the transistor M260 is connected to the ground through the variable resistance part 220.

The variable resistance part 220 has a configuration in which a resistor 221, a series circuit of a resistor 222 and a switch 224, and a series circuit of a resistor 223 and a switch 225 are connected in parallel. Thus, when the switches 224 and 225 are both in the off-state, a resistance value of the variable resistance part 220 corresponds with a resistance value of the resistor 221. When the switches 224 and 225 are both in the on-state, the resistance value of the variable resistance part 220 corresponds with a combined resistance value of the parallel circuit of the resistors 221 to 223. When the switches 224 and 225 are in the on-state and the off-state, respectively, the resistance value of the variable resistance part 220 corresponds with a combined resistance value of the parallel circuit of the resistors 221 and 222. When the switches 224 and 225 are in the off-state and the on-state, respectively, the resistance value of the variable resistance part 220 corresponds with a combined resistance value of the parallel circuit of the resistors 221 and 223.

The switch control part 230 controls the on/off-state of the switches 224 and 225 individually. In the current path CP0, a bias current $I_{BIAS}$ that flows from the drain of the transistor M110 toward the ground is determined by characteristics of the transistor M260, a bias voltage $V_{BIAS}$ applied to a gate of the transistor M260, and the resistance value of the variable resistance part 220. The part that controls the on/off-state of the switches 224 and 225 in the switch control part 230 may be interpreted as a part included in the constituent elements of the variable resistance part 220.

In the memory unit 200, the bias current $I_{BIAS}$ changes according to the on/off-state of the switches 224 and 225. Therefore, it can be said that the variable resistance part 220 is a circuit that supplies the variable bias current $I_{BIAS}$ to the input side of the current mirror circuit 210. The bias current $I_{BIAS}$ increases as the resistance value of the variable resistance part 220 decreases, and the bias current $I_{BIAS}$ decreases as the resistance value of the variable resistance part 220 increases.

In the memory unit 200,
the transistor M261 and the fuse element F1 are inserted in series on the current path CP1 of the drain current of the transistor M111,
the transistor M262 and the fuse element F2 are inserted in series on the current path CP2 of the drain current of the transistor M112,
the transistor M263 and the fuse element F3 are inserted in series on the current path CP3 of the drain current of the transistor M113, and
the transistor M264 and the fuse element F4 are inserted in series on the current path CP4 of the drain current of the transistor M114.

More specifically, in the memory unit 200,
the drain of the transistor M111 is connected to the drain of the transistor M261 at a node 281, the source of the transistor M261 is connected to a first end of the fuse element F1, and a second end of the fuse element F1 is connected to the ground,
the drain of the transistor M112 is connected to the drain of the transistor M262 at a node 282, the source of the transistor M262 is connected to a first end of the fuse element F2, and a second end of the fuse element F2 is connected to the ground,
the drain of the transistor M113 is connected to the drain of the transistor M263 at a node 283, the source of the transistor M263 is connected to a first end of the fuse element F3, and a second end of the fuse element F3 is connected to the ground, and
the drain of the transistor M114 is connected to the drain of the transistor M264 at a node 284, the source of the transistor M264 is connected to a first end of the fuse element F4, and a second end of the fuse element F4 is connected to the ground.

Voltages V1 to V4 in the memory unit 200 refer to voltages at the nodes 281 to 284, respectively. Furthermore, similarly to the description in the first embodiment, also in the second embodiment, the drain current of the transistor M111 (i.e., current that flows in the current path CP1) is represented by symbol "$I_{CP1}$." The drain current of the transistor M112 (i.e., current that flows in the current path CP2) is represented by symbol "$I_{CP2}$." The drain current of the transistor M113 (i.e., current that flows in the current path CP3) is represented by symbol "$I_{CP3}$." The drain current of the transistor M114 (i.e., current that flows in the current path CP4) is represented by symbol "$I_{CP4}$."

The fuse elements F1 to F4 are as described in the first embodiment. The current mirror circuit 210 operates to cause currents in proportion to the bias current $I_{BIAS}$ that flows in the current path CP0 to flow in the current paths CP1 to CP4 as the currents $I_{CP1}$ to $I_{CP4}$. However, when the fuse element F1 has been cut and the resistance between both ends of the fuse element F1 is sufficiently high, the current in proportion to the bias current $I_{BIAS}$ does not flow in the current path CP1. This applies also to the current paths CP2 to CP4.

The data output part 240 has the same configuration as the data output part 140 in FIG. 4 and therefore includes the AND circuits 141 to 144, the data output control part 145, and the latch circuit 146. Operations of the AND circuits 141 to 144, the data output control part 145, and the latch circuit 146 in the data output part 240 are the same as those in the data output part 140, and description of these operations in the first embodiment is applied also to the second embodiment. However, first input terminals of the AND circuits 141 to 144 in the data output part 240 are connected to the nodes 281 to 284, respectively, and receive input of the voltages of the nodes 281 to 284 (i.e., voltages V1 to V4). A signal Sig145 from the data output control part 145 is input to second input terminals of the AND circuits 141 to 144 in common.

The bias voltage supply part 250 includes a switch 251, a resistor 252, and transistors 253 to 255. The transistors 253 to 255 are configured as N-channel MOSFETs. One end of the switch 251 is connected to an application terminal of the supply voltage VDD, and another end of the switch 251 is connected to a node 256 through the resistor 252. A drain of the transistor 253 and respective gates of the transistors 253 to 255 are connected to each other in common at the node 256. A source of the transistor 253 is connected to a drain of the transistor 254. A source of the transistor 254 is connected to a drain of the transistor 255. A source of the transistor 255 is connected to the ground. The node 256 is connected to respective gates of the transistors M260 to M264 in common, and a voltage at the node 256 is supplied to the respective gates of the transistors M260 to M264 in common as the bias voltage $V_{BIAS}$.

The on/off-state of the switch 251 is controlled by the switch control part 230. When the switch 251 is in the on-state, the bias voltage $V_{BIAS}$ higher than a gate threshold voltage of the transistor M260 is applied to the gate of the transistor M260, and a drain current ($I_{BIAS}$) flows in the transistor M260. When the switch 251 is in the off-state, charge at the node 256 is drawn to the ground through a discharge resistor that is not illustrated in the diagram, and the bias voltage $V_{BIAS}$ becomes zero, so that the transistors M260 to M264 all become OFF.

The transistor M260 functions as a reference transistor, and the transistors M261 to M264 each function as a fuse-side transistor. The reference transistor and each fuse-side transistor have a same W/L ratio. The W/L ratio represents a ratio of a channel width to a channel length in the MOSFET. That is, the W/L ratio of the transistor M260, the W/L ratio of the transistor M261, the W/L ratio of the transistor M262, the W/L ratio of the transistor M263, and the W/L ratio of the transistor M264 are set identical to each other. Current supply capability of the transistor is determined by the W/L ratio. In a certain transistor (MOSFET), the current supply capability becomes higher by setting the channel length shorter and the current supply capability becomes higher also by setting the channel width longer.

A W/L ratio of each of the transistors 253 to 255 configuring the bias voltage supply part 250 may be lower than the W/L ratio of each of the transistors M260 to M264. In the bias voltage supply part 250 in FIG. 8, the bias voltage $V_{BIAS}$ higher than each gate threshold voltage of the transistors M260 to M264 is generated by cascoding a plurality of transistors (253 to 255). However, the bias voltage supply part 250 may be configured in any manner as long as the bias voltage $V_{BIAS}$ higher than each gate threshold voltage of the transistors M260 to M264 can be generated.

Now, operation of the memory unit 200 will be described with focus on the fuse element F1. When the residual resistance value of the fuse element F1 (i.e., resistance value between both ends of the fuse element F1) is equal to the resistance value of the variable resistance part 220, the current ($I_{BIAS}$) that flows in the transistor M260 becomes equal to the current ($I_{CP1}$) that flows in the transistor M261, and the circuit becomes the balanced state regarding these currents. The voltage V1 at the node 281 lowers to near 0 V when the residual resistance value of the fuse element F1 becomes smaller even slightly, with this balanced state being the basis. Conversely, the voltage V1 at the node 281 rises to near the supply voltage VDD when the residual resistance value of the fuse element F1 becomes larger even slightly, with this balanced state being the basis. That is, a circuit that compares the resistance value of the variable resistance part 220 with the residual resistance value of the fuse element F1 is configured by the transistors M260 and M261 and the transistors M110 and M111. This applies also to the fuse elements F2 to F4.

Furthermore, on a premise that the switch 224 is set ON and the switch 225 is set OFF and output data D1 to D4 are read out in the normal mode, the consistency between the output data D1 to D4 when the switches 224 and 225 are OFF and the output data D1 to D4 when the switches 224 and 225 are ON is evaluated in the test mode. This can easily check whether or not an abnormality of the fuse elements F1 to F4 exists (whether or not an abnormal residual resistance value exists).

With reference to FIG. 9 and FIG. 10, a flow of operation in the normal mode and the test mode will be described. FIG. 9 is an operation flowchart of the memory unit 200 in the normal mode. In the normal mode, first, the switch 251 is set to the on-state in a step S61. In a subsequent step S62, the switch 224 is set to the on-state and the switch 225 is set to the off-state by the switch control part 230. As a result, the resistance value of the variable resistance part 220 is set to a reference resistance value, and the bias current $I_{BIAS}$ according to the reference resistance value and the bias voltage $V_{BIAS}$ flows in the current path CP0. The reference resistance value is equal to the combined resistance value of the parallel circuit of the resistors 221 and 222. The bias current $I_{BIAS}$ when the resistance value of the variable resistance part 220 is set to the reference resistance value is defined as a current $I_M$. In a subsequent step S63, the signal Sig145 is set to the high level, and data D1' to D4' when the signal Sig145 is set to the high level are latched and acquired in the latch circuit 146.

As above, in the normal mode, the data D1' to D4' according to the voltages V1 to V4 when "$I_{BIAS}=I_M$" is satisfied become the output data D1 to D4 (hereinafter, possibly referred to as readout data). That is, the data D1' to D4' according to the voltages V1 to V4 when supply of reference currents ($I_{CP1}$ to $I_{CP4}$) in proportion to the current $I_M$ to the current paths CP1 to CP4 is intended are acquired as the readout data D1 to D4. After the data D1' to D4' are acquired as the readout data D1 to D4 according to the voltages V1 to V4 when "$I_{BIAS}=I_M$" is satisfied, the signal Sig145 is set to the low level in a step S64. Furthermore, the switch 251 is switched to the off-state in a step S65. Due to the switching of the switch 251 to the off-state, the bias current $I_{BIAS}$ becomes zero, so that the unnecessary circuit current is reduced.

The readout data D1 to D4 acquired in the normal mode in the memory unit 200 are supplied to the functional circuit unit 30 (see FIG. 1) as data of 4 bits stored in the memory unit 200.

FIG. 10 is an operation flowchart of the memory unit 200 in the test mode. However, good-or-bad determination processing of a step S74 in FIG. 10 is executed outside the memory unit 200.

In the test mode, first, the switch 251 is set to the on-state in a step S71. In a subsequent step S72, the switches 224 and 225 are both set to the off-state by the switch control part 230. Thereafter, the signal Sig145 is set to the high level by the data output control part 145, and the data D1' to D4' at the time are latched by the latch circuit 146 to thereby acquire the data D1 to D4. When the switches 224 and 225 are in the off-state, the resistance value of the variable resistance part 220 is the resistance value itself of the resistor 221 and therefore is larger than the above-described reference resistance value (combined resistance value of the parallel circuit of the resistors 221 and 222). As a result, the bias current $I_{BIAS}$ when the switches 224 and 225 are in the off-state becomes a current $I_S$ smaller than the above-described current $I_M$. The data D1 to D4 acquired in the step S72, i.e., the output data D1 to D4 according to the voltages V1 to V4 when "$I_{BIAS}=I_S$" is satisfied, function as first test result data. As above, the data D1 to D4 according to the voltages V1 to V4 when supply of first test currents ($I_{CP1}$ to $I_{CP4}$) in proportion to the current $I_S$ to the current paths CP1 to CP4 is intended are acquired as the first test result data. The first test currents are smaller than the above-described reference currents.

In a subsequent step S73, the switches 224 and 225 are both set to the on-state by the switch control part 230. Thereafter, the signal Sig145 is set to the high level by the data output control part 145, and the data D1' to D4' at the time are latched by the latch circuit 146 to thereby acquire the data D1 to D4. When the switches 224 and 225 are in the on-state, the resistance value of the variable resistance part 220 is the combined resistance value of the parallel circuit of the resistors 221 to 223 and therefore is smaller than the above-described reference resistance value (combined resistance value of the parallel circuit of the resistors 221 and 222). As a result, the bias current $I_{BIAS}$ when the switches 224 and 225 are in the on-state becomes a current $I_L$ larger than the above-described current $I_M$. The data D1 to D4 acquired in the step S73, i.e., the output data D1 to D4 according to the voltages V1 to V4 when "$I_{BIAS}=I_L$" is satisfied, function as second test result data. As above, the data D1 to D4 according to the voltages V1 to V4 when supply of second test currents ($I_{CP1}$ to $I_{CP4}$) in proportion to the current $I_L$ to the current paths CP1 to CP4 is intended are acquired as the second test result data. The second test currents are larger than the above-described reference currents. For example, the resistance value of the resistors 221 to 223 and so forth can be settled in such a manner that the currents $I_S$, $I_M$, and $I_L$ become 1 μA, 10 μA, and 100 μA, respectively.

Thereafter, in the step S74, the good-or-bad determination processing based on the first test result data and the second test result data is executed. In the good-or-bad determination processing, whether or not the storing state of data by the memory unit 200 is good is determined. In the good-or-bad determination processing, that it is determined that the storing state of data by the memory unit 200 is good is referred to as good-product determination, and that it is determined that the storing state of data by the memory unit 200 is not good is referred to as defectiveness determination. The semiconductor device 1 regarding which the good-product determination is made in the good-or-bad determination processing is determined as a good product to become a target of shipping. However, the semiconductor device 1 regarding which the defectiveness determination is made in the good-or-bad determination processing is determined as a defective product not to become a target of shipping.

In the good-or-bad determination processing, consistency between the first test result data and the second test result data is evaluated. The good-product determination is made only when the first and second test result data correspond with each other, and the defectiveness determination is made when the first and second test result data do not correspond with each other. As described above, that the first and second test result data correspond with each other means that the data D1 to D4 of 4 bits forming the first test result data completely correspond with the data D1 to D4 of 4 bits forming the second test result data. When a difference exists even in 1 bit, it is determined that the first and second test result data do not correspond with each other.

As described above, in the normal mode, stored data of the memory unit 200 is read out in the state of "$I_{BIAS}=I_M$." Meanwhile, that there is no difference between the data D1 to D4 in the state of "$I_{BIAS}=I_S$" (first test result data) and the data D1 to D4 in the state of "$I_{BIAS}=I_L$" (second test result data) means that there is no change in the data D1 to D4 in a range in which "$I_S \leq I_{BIAS} \leq I_L$" is satisfied.

Thus, in the semiconductor device 1 regarding which the good-product determination has been made, it is expected that the correct data D1 to D4 are read out from the memory unit 200 stably in the normal mode even when a certain degree of temperature change or aging occurs. Due to the good-or-bad determination processing, it becomes possible to exclude the semiconductor device 1 involving a possibility of the occurrence of output logical inversion from the target of shipping as a defective product. Therefore, the occurrence of output logical inversion in the market can be suppressed. As a result, the reliability of the semiconductor device 1 (reliability of the semiconductor device 1 brought to the market) can be enhanced.

The above flow can be carried out not only at the time of shipping inspection but also as a self-test after shipping to detect the occurrence of breakdown previously. For example, in a system that reads data of a memory at the time of activation of the semiconductor device, after the flow of the steps S71 to S74 in FIG. 10 is carried out at the time of the activation, the semiconductor device is activated in the normal mode, and a flag can be simultaneously output if an abnormality exists. The flag may be a signal of CMOS output or open drain output. In a semiconductor device including a serial interface, the flow of FIG. 10 is carried out by inputting the test mode from the outside, and information regarding an abnormal place is stored in a register if an abnormality exists. Then, the register is read by the serial interface again and thereby the abnormal place can be identified.

Supplementary explanation will be made regarding the operation and characteristics of the memory unit 200 of FIG. 8. For convenience of explanation, focus will be made on a set of the transistor M261 and the fuse element F1 among the transistors M261 to M264 and the fuse elements F1 to F4. Suppose that the switch 251 is in the on-state. Furthermore, suppose that a source area ratio between the transistors M110 and M111 is set in such a manner that a ratio between the bias current $I_{BIAS}$ and the current $I_{CP1}$ becomes "1:1" under an assumption that the residual resistance value of the fuse element F1 is sufficiently low. Moreover, the residual resistance value of the fuse element F1 is represented by symbol "R_F1," and the resistance value of the variable resistance part 220 is represented by symbol "R_REF."

The voltage lower than the bias voltage $V_{BIAS}$ generated by using the transistors 253 to 255 by a gate-source voltage of the transistor M260 is applied to both ends of the variable resistance part 220, and thereby the bias current $I_{BIAS}$ flows in the current path CP0. Thereupon, the current mirror circuit 210 operates to cause the current $I_{CP1}$ with the same magnitude as the bias current $I_{BIAS}$ to flow through the transistor M111.

Here, if the residual resistance value of the fuse element F1 is sufficiently small, the current $I_{CP1}$ with the same magnitude as the bias current $I_{BIAS}$ flows to the fuse element F1 through the current path CP1, and a voltage ($I_{BIAS} \times$R_F1) is generated between both ends of the fuse element F1. That is, when "R_F1<R_REF" is satisfied, "(gate-source voltage of the transistor M260)<(gate-source voltage of the transistor M261)" is satisfied. Therefore, the state in which the transistor M261 is higher than the transistor M260 in the current supply capability is obtained, and it becomes possible to cause the current $I_{CP1}$ with the same magnitude as the bias current $I_{BIAS}$ to completely flow to the ground through the fuse element F1. As a result, the voltage V1 lowers to near 0 V. In practice, the voltage V1 becomes a voltage obtained by adding the drain-source voltage of the transistor M260 to the voltage ($I_{BIAS} \times$R_F1). However, if the low level of the voltage V1 has been confirmed also when "$I_{BIAS}=I_S$" and "$I_{BIAS}=I_L$" are set in the test mode, the voltage V1 becomes low enough to be classified into the low level also under a condition of "$I_{BIAS}=I_M$" in the normal mode.

On the other hand, in the case of "R_F1>R_REF," when it is assumed that the current $I_{CP1}$ with the same magnitude as the bias current $I_{BIAS}$ can be caused to completely flow to the ground through the fuse element F1, the voltage ($I_{BIAS} \times$ R_F1) is generated between both ends of the fuse element F1, and therefore "(gate-source voltage of the transistor M260)>(gate-source voltage of the transistor M261)" is satisfied. Therefore, if the above-described assumption holds true, the transistor M261 heads to OFF and a contradiction arises (this means that the above-described assumption does not hold true). That is, in the case of "R_F1>R_REF," it is difficult to cause the current $I_{CP1}$ with the same magnitude as the bias current $I_{BIAS}$ to completely flow to the ground through the fuse element F1. As a result, the voltage V1 rises to near the supply voltage VDD.

As above, the circuit that sharply changes the voltage V1 depending on whether the residual resistance value of the fuse element F1 is larger or smaller than the resistance value of the variable resistance part 220 is disposed in the memory unit 200. Furthermore, reliability of the memory unit 200 is ensured by checking whether inversion of the output data D1 does not occur when the resistance value of the variable resistance part 220 is changed in a predetermined range in the test mode. This applies also to the fuse elements F2 to F4 and the output data D2 to D4 corresponding to them.

In FIG. 11, a relation between several voltages and the supply voltage VDD in the memory unit 200 is illustrated. In FIG. 11, a dashed line segment 625 represents a relation between a threshold voltage Vth_AND in the AND circuit 141 and the supply voltage VDD. A full line segment 621 represents a relation between the voltage V1 and the supply voltage VDD when "R_F1<R_REF" is satisfied. A full line segment 622 represents a relation between the voltage V1 and the supply voltage VDD when "R_F1>R_REF" is satisfied. The voltage V1 becomes the low level (becomes lower than the threshold voltage Vth_AND) independently of the supply voltage VDD when "R_F1<R_REF" is satisfied, and the voltage V1 becomes the high level (becomes higher than the threshold voltage Vth_AND) independently of the supply voltage VDD when "R_F1>R_REF" is satisfied. That is, the supply voltage dependence (see FIG. 7) that exists in the memory unit 100 of FIG. 4 hardly arises in the memory unit 200.

Third Embodiment

The third embodiment of the present disclosure will be described. In the third embodiment, specific contents of the good-or-bad determination processing described in the first and second embodiments will be described.

Figure 12:
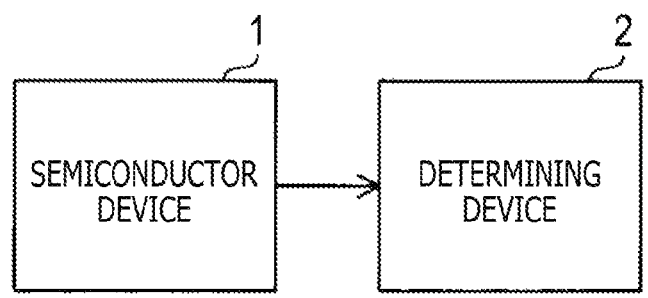
FIG. 12 is a configuration diagram of a memory abnormality determination system according to a third embodiment of the present disclosure.

The good-or-bad determination processing can be executed by configuring a memory abnormality determination system including the semiconductor device 1 and a determining device 2 like one illustrated in FIG. 12. The determining device 2 is a device disposed outside the semiconductor device 1. The determining device 2 is connected to an external terminal of the semiconductor device 1 in the test mode and executes the good-or-bad determination processing by receiving a signal to be used for the good-or-bad determination processing from the semiconductor device 1 through the external terminal.

Figure 13:
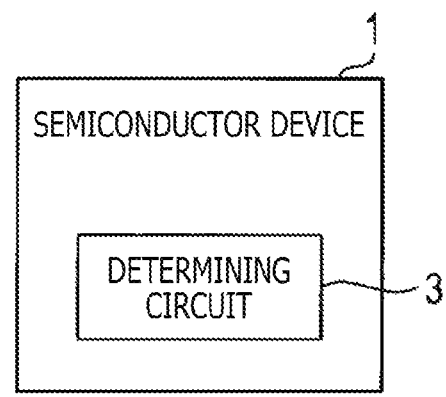
FIG. 13 is a configuration diagram of a semiconductor device according to the third embodiment of the present disclosure.

Alternatively, as illustrated in FIG. 13, a determining circuit 3 that executes the good-or-bad determination processing may be disposed in the semiconductor device 1. The determining circuit 3 executes the good-or-bad determination processing by receiving a signal to be used for the good-or-bad determination processing through an interconnect line in the semiconductor device 1.

The signal to be used for the good-or-bad determination processing is a signal based on the above-described first test result data and second test result data and can be a signal itself that indicates the first test result data and the second test result data. That is, the determining device 2 or the determining circuit 3 determines whether or not an abnormality of the fuse elements F1 to F4 exists (whether or not the fuse elements F1 to F4 have an abnormal residual resistance value) on the basis of the first test result data and the second test result data.

When the memory unit 100 of FIG. 4 is used, the first test result data are the output data D1 to D4 acquired in the step S22 in FIG. 6, and the second test result data are the output data D1 to D4 acquired in the step S23 in FIG. 6. When the memory unit 200 of FIG. 8 is used, the first test result data are the output data D1 to D4 acquired in the step S72 in FIG. 10, and the second test result data are the output data D1 to D4 acquired in the step S73 in FIG. 10. Hereinafter, the output data D1 to D4 that configure the first test result data are sometimes represented as data D1$a$ to D4$a$, respectively, in particular, and the output data D1 to D4 that configure the second test result data are sometimes represented as data D1$b$ to D4$b$, respectively, in particular.

Furthermore, for convenience of explanation, a term "determining block" is introduced. The determining block refers to either of the determining device 2 and the determining circuit 3 and therefore is represented as the determining block (2, 3) in some cases. The good-or-bad determination processing executed by the determining block is executed by the determining device 2 in the configuration of FIG. 12 and is executed by the determining circuit 3 in the configuration of FIG. 13. When the good-product determination is made in the good-or-bad determination processing, a good-product determination signal that represents this is output from the determining block (2, 3). When the defectiveness determination is made in the good-or-bad determination processing, a defectiveness determination signal that represents this is output from the determining block (2, 3). The determining block (2, 3) can implement the good-or-bad determination processing by any of the following first to fourth determination methods. [First Determination Method]

In the good-or-bad determination processing according to the first determination method, the determining block (2, 3) compares the first test result data with the second test result data one bit by one bit individually. That is, the determining block (2, 3) according to the first determination method compares the data D1$a$ to D4$a$ with the data D1$b$ to D4$b$ one bit by one bit. Then, the determining block (2, 3) outputs the good-product determination signal only in the case in which the data D1$a$ corresponds with the data D1$b$, the data D2$a$ corresponds with the data D2$b$, the data D1$a$ corresponds with the data D3$b$, and the data D4$a$ corresponds with the data D4$b$. The determining block (2, 3) outputs the defectiveness determination signal in any case other than that.

Second Determination Method

In the good-or-bad determination processing according to the second determination method, the determining block (2, 3) compares the first test result data with the second test result data collectively. That is, the determining block (2, 3) according to the second determination method compares the data D1$a$ to D4$a$ with the data D1$b$ to D4$b$ collectively. Then, the determining block (2, 3) outputs the good-product determination signal only in the case in which the data D1$a$ corresponds with the data D1$b$, the data D2$a$ corresponds with the data D2$b$, the data D1$a$ corresponds with the data D3$b$, and the data D4$a$ corresponds with the data D4$b$. The determining block (2, 3) outputs the defectiveness determination signal in any case other than that.

It can be said that the first determination method and the second determination method are substantially equivalent determination methods. In either determination method, whether or not an abnormality of each fuse element exists is determined based on comparison between the first test result data and the second test result data.

Third Determination Method

Figure 14:
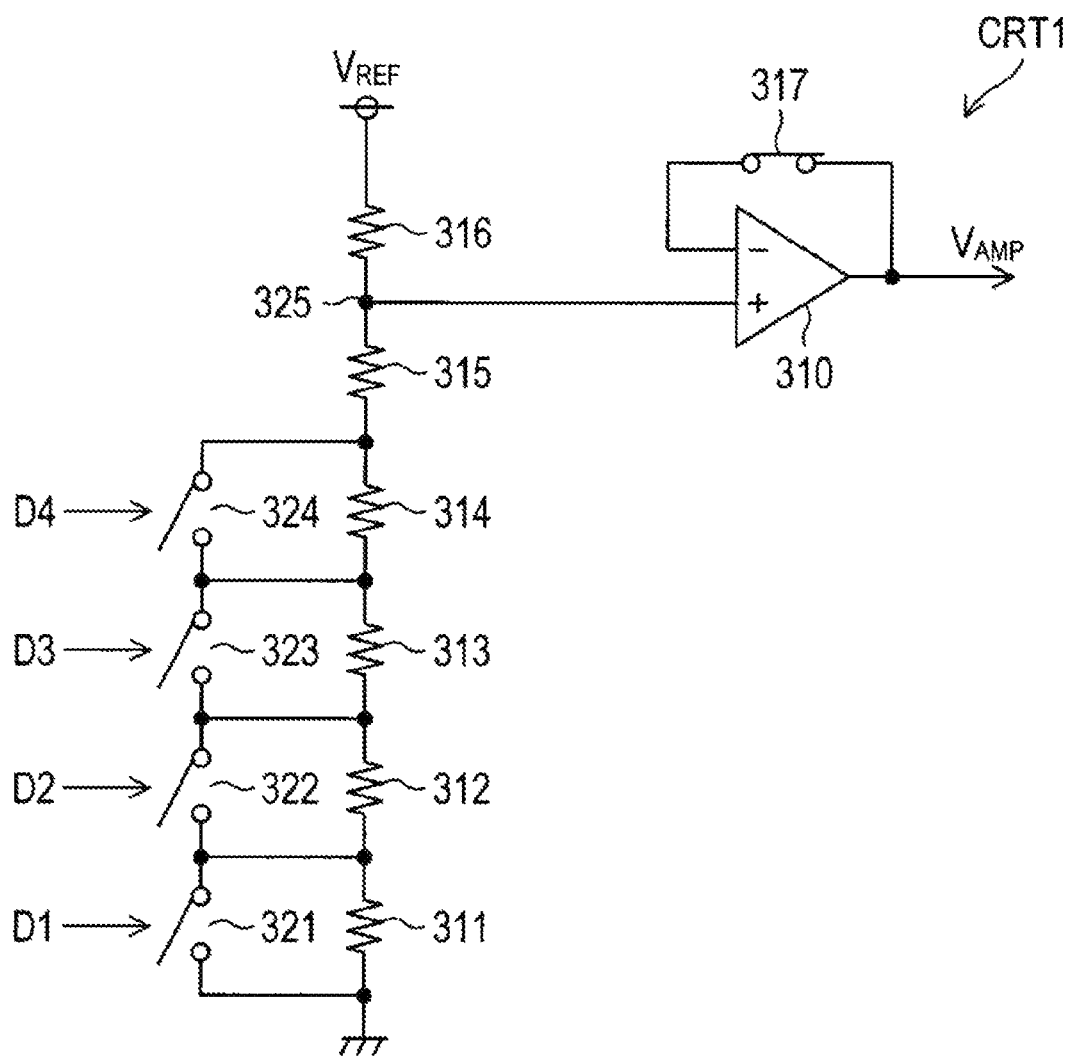
FIG. 14 relates to the third embodiment of the present disclosure and is a diagram illustrating one example of a circuit used for abnormality determination of a memory.

The third determination method is based on a premise that an amplifier that is an operational amplifier is disposed in the semiconductor device 1. The good-or-bad determination processing according to the third determination method will be described with reference to FIG. 14. A circuit CRT1 that is illustrated in FIG. 14 and includes an amplifier 310, voltage dividing resistors 311 to 316, and switches 317 and 321 to 324 can be disposed in the semiconductor device 1 (particularly in the functional circuit unit 30, for example).

In the circuit CRT1, the voltage dividing resistors 311 to 316 are connected in series in order of the voltage dividing resistors 311 to 316 from the ground toward an application terminal of a reference voltage $V_{REF}$ (terminal to which the reference voltage $V_{REF}$ is applied), and the reference voltage $V_{REF}$ is applied to the series circuit of the voltage dividing resistors 311 to 316. The reference voltage $V_{REF}$ is a predetermined positive direct-current voltage generated in the semiconductor device 1 on the basis of the input voltage Vin. The switches 321 to 324 are connected in parallel to the voltage dividing resistors 311 to 314, respectively. A non-inverting input terminal of the amplifier 310 is connected to a node 325 that is a connecting node between the voltage dividing resistors 315 and 316. One end of the switch 317 is connected to the inverting input terminal of the amplifier 310, and another end of the switch 317 is connected to an output terminal of the amplifier 310.

The on/off-state of each of the switches 321 to 324 is controlled based on the output data D1 to D4 of the memory unit 100 or 200. Specifically, when the output data D1 supplied to the switch 321 is "0" and "1," the switch 321 becomes the off-state and the on-state, respectively. Similarly, when the output data D2 supplied to the switch 322 is "0" and "1," the switch 322 becomes the off-state and the on-state, respectively. This applies also to a set of the switch 323 and the output data D3 and a set of the switch 324 and the output data D4.

The reference voltage $V_{REF}$ is divided by a voltage dividing circuit including the voltage dividing resistors 311 to 316, and the divided voltage (voltage at the node 325) is input to the non-inverting input terminal of the amplifier 310. A voltage division ratio thereof depends on the on/off-state of the switches 321 to 324.

In the test mode, the switch 317 is turned ON, and an output voltage VAMP of the amplifier 310 corresponds with the voltage at the node 325 as a result. In the test mode, the output data D1 to D4 that configure the first test result data are supplied to the switches 321 to 324, and the value of the output voltage $V_{AMP}$ of the amplifier 310 at the time is acquired by the determining block (2, 3) as a first evaluation value $V_{AMP1}$. Separately from this, in the test mode, the output data D1 to D4 that configure the second test result data are supplied to the switches 321 to 324, and the value of the output voltage $V_{AMP}$ of the amplifier 310 at the time is acquired by the determining block (2, 3) as a second evaluation value $V_{AMP2}$. If the determining block is the determining device 2 (FIG. 12), the output voltage $V_{AMP}$ of the amplifier 310 in the test mode may be output from an external terminal of the semiconductor device 1 and supplied to the determining device 2.

The determining block (2, 3) compares the evaluation values $V_{AMP1}$ and $V_{AMP2}$ in the good-or-bad determination processing. When the evaluation values $V_{AMP1}$ and $V_{AMP2}$ correspond with each other, the determining block (2, 3) determines that the first and second test result data correspond with each other and outputs the good-product determination signal. When the evaluation values $V_{AMP1}$ and $V_{AMP2}$ do not correspond with each other, the determining block (2, 3) determines that the first and second test result data do not correspond with each other and outputs the defectiveness determination signal. In the case in which the first and second test result data correspond with each other, there is no change in the voltage division ratio when the voltage of the node 325 is obtained from the reference voltage $V_{REF}$ between when the first test result data are supplied to the switches 321 to 324 and when the second test result data are supplied to the switches 321 to 324. As a result, it is expected that the evaluation values $V_{AMP1}$ and $V_{AMP2}$ correspond with each other. In the case in which the first and second test result data do not correspond with each other, change arises in the above-described voltage division ratio, and the evaluation values $V_{AMP1}$ and $V_{AMP2}$ do not correspond with each other. That the evaluation values $V_{AMP1}$ and $V_{AMP2}$ correspond with each other is a concept having a width. When an absolute value of a difference between the evaluation values $V_{AMP1}$ and $V_{AMP2}$ is equal to or smaller than a minute predetermined value, it may be determined that the evaluation values $V_{AMP1}$ and $V_{AMP2}$ correspond with each other.

Fourth Determination Method

Figure 15:
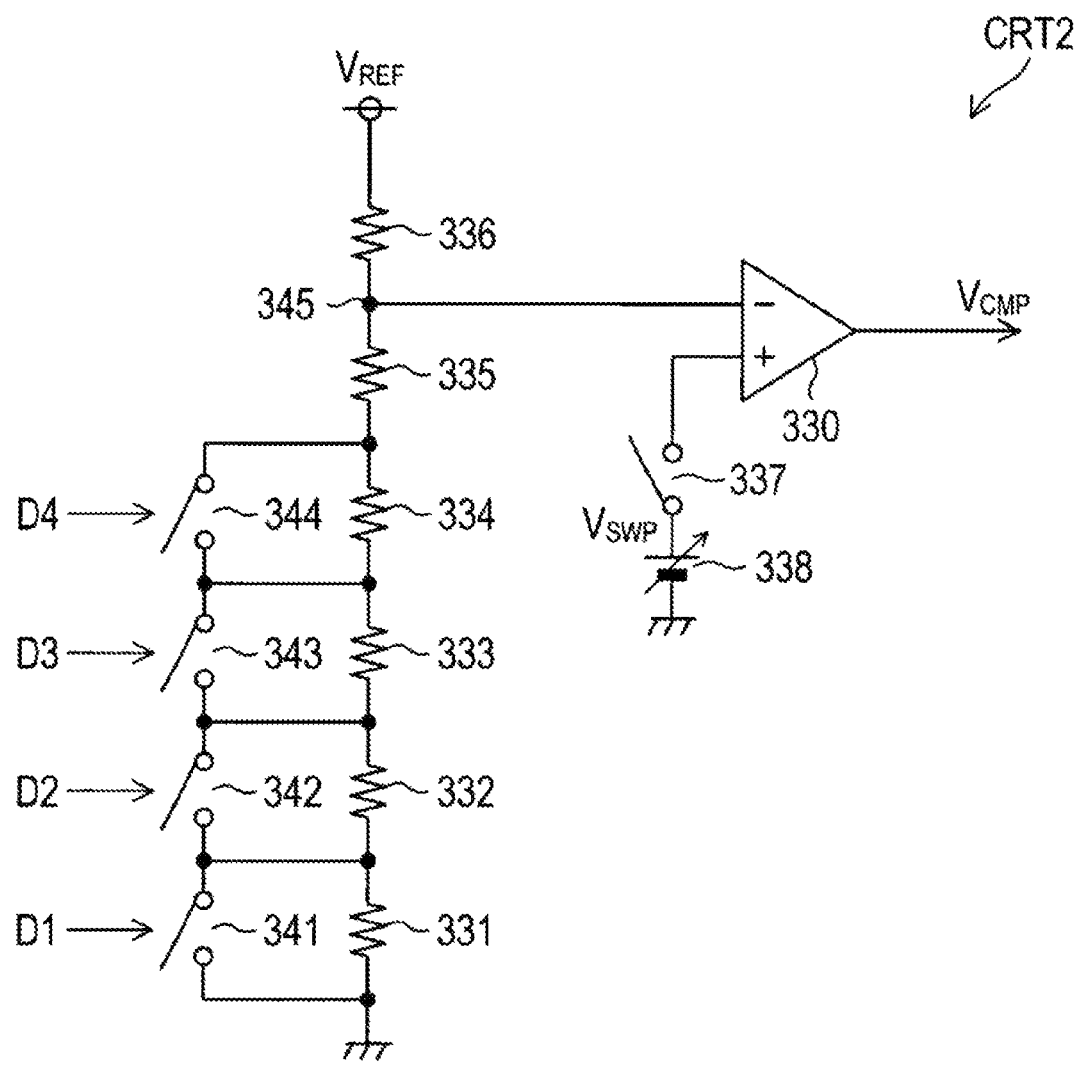
FIG. 15 relates to the third embodiment of the present disclosure and is a diagram illustrating another example of the circuit used for abnormality determination of the memory.

The fourth determination method is based on a premise that a comparator is disposed in the semiconductor device 1. The good-or-bad determination processing according to the fourth determination method will be described with reference to FIG. 15. A circuit CRT2 that is illustrated in FIG. 15 and includes a comparator 330, voltage dividing resistors 331 to 336, switches 337 and 341 to 344, and a variable voltage source 338 can be disposed in the semiconductor device 1 (particularly in the functional circuit unit 30, for example).

In the circuit CRT2, the voltage dividing resistors 331 to 336 are connected in series in order of the voltage dividing resistors 331 to 336 from the ground toward an application terminal of the reference voltage VREF, and the reference voltage VREF is applied to the series circuit of the voltage dividing resistors 331 to 336. The switches 341 to 344 are connected in parallel to the voltage dividing resistors 331 to 334, respectively. An inverting input terminal of the comparator 330 is connected to a node 345 that is a connecting node between the voltage dividing resistors 335 and 336. The variable voltage source 338 outputs a sweep voltage $V_{SWP}$ that monotonically increases from a predetermined lower-limit voltage to a predetermined upper-limit voltage at a predetermined voltage change rate in the test mode. The switch 337 is disposed between an output end of the variable voltage source 338 and the non-inverting input terminal of the comparator 330, and the sweep voltage $V_{SWP}$ is supplied to the non-inverting input terminal of the comparator 330 only when the switch 337 is in the on-state.

The on/off-state of each of the switches 341 to 344 is controlled based on the output data D1 to D4 of the memory unit 100 or 200. Specifically, when the output data D1 supplied to the switch 341 is "0" and "1," the switch 341 becomes the off-state and the on-state, respectively. Similarly, when the output data D2 supplied to the switch 342 is "0" and "1," the switch 342 becomes the off-state and the on-state, respectively. This applies also to a set of the switch 343 and the output data D3 and a set of the switch 344 and the output data D4.

The reference voltage $V_{REF}$ is divided by a voltage dividing circuit including the voltage dividing resistors 331 to 336, and the divided voltage (voltage at the node 345) is input to the inverting input terminal of the comparator 330. A voltage division ratio thereof depends on the on/off-state of the switches 341 to 344.

The switch 337 is turned ON in the test mode. In the test mode, a monotonic increase in the sweep voltage $V_{SWP}$ is carried out in a first state in which the output data D1 to D4 that configure the first test result data are supplied to the switches 341 to 344. The value of the sweep voltage $V_{SWP}$ when an output voltage $V_{CMP}$ of the comparator 330 is switched from a low level to a high level in the process of the monotonic increase in the sweep voltage $V_{SWP}$ in the first state is acquired by the determining block (2, 3) as a first evaluation value $V_{SWP1}$. Separately from this, in the test mode, a monotonic increase in the sweep voltage $V_{SWP}$ is carried out in a second state in which the output data D1 to D4 that configure the second test result data are supplied to the switches 341 to 344. The value of the sweep voltage $V_{SWP}$ when the output voltage $V_{CMP}$ of the comparator 330 is switched from the low level to the high level in the process of the monotonic increase in the sweep voltage $V_{SWP}$ in the second state is acquired by the determining block (2, 3) as a second evaluation value $V_{SWP2}$.

The determining block (2, 3) compares the evaluation values $V_{SWP1}$ and $V_{SWP2}$ in the good-or-bad determination processing. When the evaluation values $V_{SWP1}$ and $V_{SWP2}$ correspond with each other, the determining block (2, 3) determines that the first and second test result data correspond with each other and outputs the good-product determination signal. When the evaluation values $V_{SWP1}$ and $V_{SWP2}$ do not correspond with each other, the determining block (2, 3) determines that the first and second test result data do not correspond with each other and outputs the defectiveness determination signal. In the case in which the first and second test result data correspond with each other, there is no change in the voltage division ratio when the voltage of the node 345 is obtained from the reference voltage VREF between when the first test result data are supplied to the switches 341 to 344 and when the second test result data are supplied to the switches 341 to 344. As a result, it is expected that the evaluation values $V_{SWP1}$ and $V_{SWP2}$ correspond with each other. In the case in which the first and second test result data do not correspond with each other, change arises in the above-described voltage division ratio, and the evaluation values $V_{SWP1}$ and $V_{SWP2}$ do not correspond with each other. That the evaluation values $V_{SWP1}$ and $V_{SWP2}$ correspond with each other is a concept having a width. When an absolute value of a difference between the evaluation values $V_{SWP1}$ and $V_{SWP2}$ is equal to or smaller than a minute predetermined value, it may be determined that the evaluation values $V_{SWP1}$ and $V_{SWP2}$ correspond with each other.

The third determination method corresponding to FIG. 14 and the fourth determination method corresponding to FIG. 15 both belong to the method in which whether or not an abnormality of each fuse element exists is determined based on comparison between first information ($V_{AMP1}$, $V_{SWP1}$) according to the first test result data and second information ($V_{AMP2}$, $V_{SWP2}$) according to the second test result data. Although the first evaluation values $V_{AMP1}$ and $V_{SWP1}$ are cited as examples of the first information and the second evaluation values $V_{AMP2}$ and $V_{SWP2}$ are cited as examples of the second information, the first information and the second information may be set in any manner as long as they are information sufficient to make a distinction of consistency/inconsistency between the first and second test result data.

An amplifier or comparator used in a normal function may be diverted as the amplifier used in the third determination method or the comparator used in the fourth determination method. In a self-test after shipping, it is difficult to divert an amplifier or comparator used in a normal function because normal operation is affected. For this reason, in the case of carrying out a self-test after shipping, it is desirable that the semiconductor device include an amplifier or comparator for the test or the first determination method or the second determination method be used.

Fourth Embodiment

Figure 16:
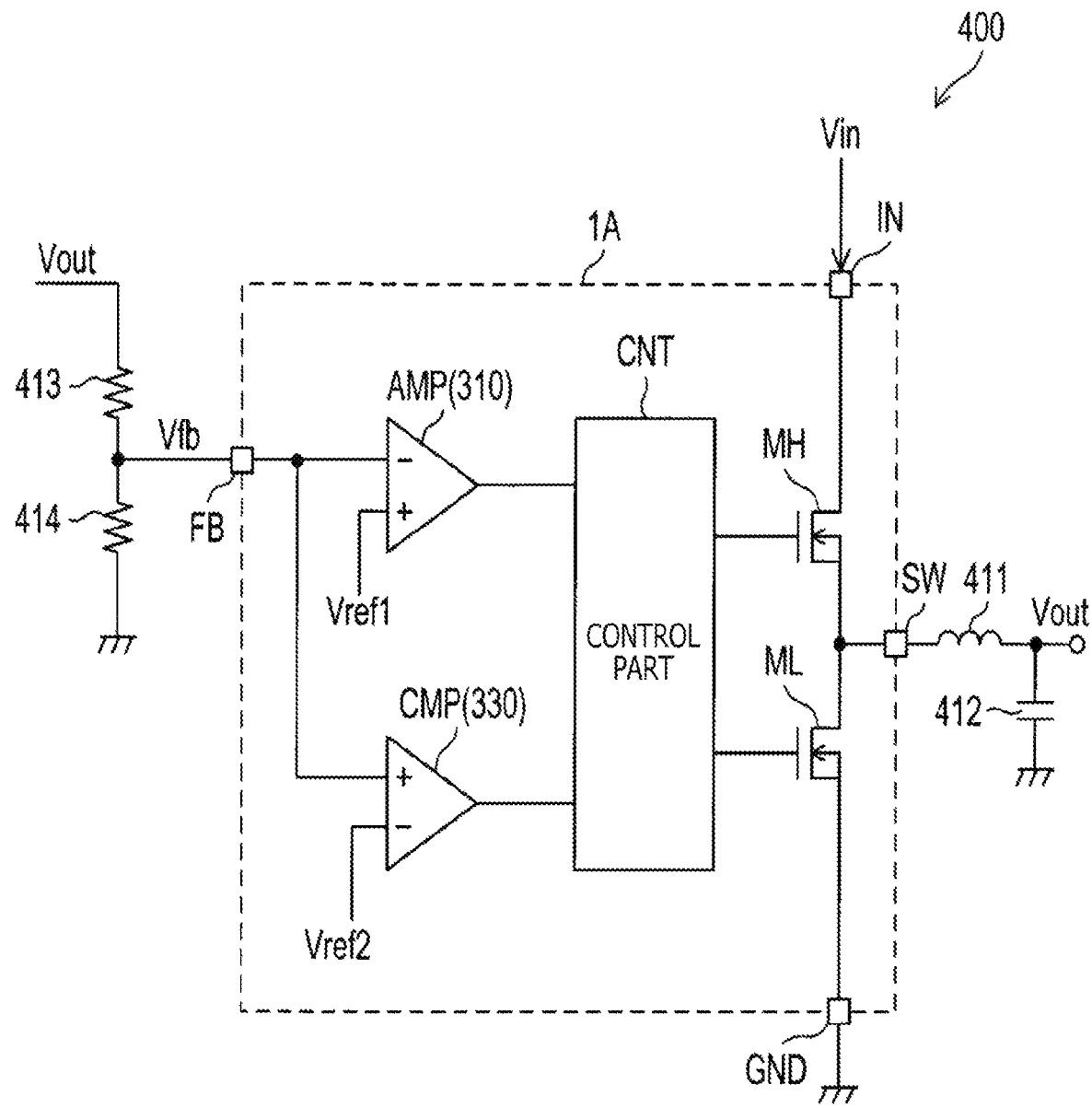
FIG. 16 is a configuration diagram of a power supply device according to a fourth embodiment of the present disclosure.

The fourth embodiment of the present disclosure will be described. In FIG. 16, a configuration of a power supply device 400 according to the fourth embodiment is illustrated. The power supply device 400 is a buck switching power supply device that generates an output voltage Vout that should be stabilized at a predetermined target voltage from an input voltage Vin. The power supply device 400 includes a semiconductor device 1A that is an example of the above-described semiconductor device 1 and a coil 411, a smoothing capacitor 412, and feedback resistors 413 and 414 that are disposed outside the semiconductor device 1A. The semiconductor device 1A includes an amplifier AMP, a comparator CMP, a control part CNT, and transistors MH and ML. The amplifier AMP, the comparator CMP, the control part CNT, and the transistors MH and ML are constituent elements of the functional circuit unit 30 (FIG. 1) in the semiconductor device 1A.

Terminals IN, SW, FB, and GND are disposed in the semiconductor device 1A as external terminals. Supply of the input voltage Vin is received at the terminal IN, and input of a feedback voltage Vfb is received at the terminal FB. The terminal GND is connected to the ground. The transistor MH is disposed in series between the terminals IN and SW, and the transistor ML is disposed in series between the terminals SW and GND. A half-bridge circuit is configured by the transistors MH and ML. The transistors MH and ML can be configured as N-channel MOSFETs.

One end of the coil 411 is connected to the terminal SW and the other end of the coil 411 is connected to the ground through the smoothing capacitor 412. The output voltage Vout is generated between both ends of the smoothing capacitor 412. The output voltage Vout is divided by the feedback resistors 413 and 414, and the division result is input to the terminal FB as the feedback voltage Vfb. The amplifier AMP outputs an error signal according to an error between the feedback voltage Vfb and a predetermined reference voltage Vref1. The comparator CMP outputs a signal that indicates a level relation between the feedback voltage Vfb and a predetermined reference voltage Vref2. The control part CNT generates a voltage with a rectangular wave shape at the terminal SW by carrying out switching of the transistors MH and ML (i.e., alternately switching ON/OFF the transistors MH and ML), and the output voltage Vout is generated through smoothing of the voltage at the terminal SW by the coil 411 and the smoothing capacitor 412. At this time, the output voltage Vout can be stabilized to a desired target voltage by adjusting a duty of the switching according to the error signal from the amplifier AMP.

Furthermore, the control part CNT can also carry out control to stop the switching of the transistors MH and ML on the basis of the output signal of the comparator CMP for the purpose of light-load control or overvoltage protection. For example, the switching of the transistors MH and ML is stopped when a signal indicating that "Vfb>Vref2" is satisfied is output from the comparator CMP.

The amplifier AMP may be the amplifier 310 in FIG. 14. In this case, in the normal mode, the switch 317 is turned OFF and the terminal FB is connected to the inverting input terminal of the amplifier 310 (switch that implements such a connection and is not illustrated in the diagram is disposed in the semiconductor device 1A). Furthermore, in the normal mode, the voltage at the node 325 is input to the non-inverting input terminal of the amplifier AMP (310) as the reference voltage Vref1 in the state in which the readout data D1 to D4 (see FIG. 5 and FIG. 9) are supplied to the switches 321 to 324. At this time, the readout data D1 to D4 function as data for adjusting (trimming) the reference voltage Vref1.

The comparator CMP may be the comparator 330 in FIG. 15. In this case, in the normal mode, the switch 337 is turned OFF and the terminal FB is connected to the non-inverting input terminal of the comparator 330 (switch that implements such a connection and is not illustrated in the diagram is disposed in the semiconductor device 1A). Furthermore, in the normal mode, the voltage at the node 345 is input to the inverting input terminal of the comparator CMP (330) as the reference voltage Vref2 in the state in which the readout data D1 to D4 (see FIG. 5 and FIG. 9) are supplied to the switches 341 to 344. At this time, the readout data D1 to D4 function as data for adjusting (trimming) the reference voltage Vref2.

As above, in the third and fourth determination methods described in the third embodiment, the good-or-bad determination processing may be executed by using a circuit component (here, amplifier or comparator) included for implementation of the function of the functional circuit unit 30 originally.

In the example of FIG. 16, the non-volatile memory unit 10 (100, 200) is used for adjustment of the reference voltage. However, the non-volatile memory unit 10 (100, 200) may be used in any manner. For example, when a filter part (not illustrated) is disposed in the functional circuit unit 30, adjustment of filter characteristics of the filter part in the normal mode may be carried out based on stored data (readout data D1 to D4) of the non-volatile memory unit 10. Furthermore, for example, when a ramp voltage generating part that generates a ramp voltage with a voltage value that cyclically changes with a saw wave shape or triangular wave shape is disposed in the functional circuit unit 30, adjustment of a frequency of the ramp voltage in the normal mode may be carried out based on stored data (readout data D1 to D4) of the non-volatile memory unit 10.

The function itself of the functional circuit unit 30 may be changed based on stored data of the non-volatile memory unit 10.

For example, the above-described ramp voltage generating part may be disposed in the control part CNT in FIG. 16. In this case, the control part CNT carries out switching of the transistors MH and ML at the frequency of the ramp voltage. The frequency of the ramp voltage may be greatly changed beyond a range of fine adjustment according to the readout data D1 to D4 from the non-volatile memory unit 10 in the normal mode. For example, when focus is made only on the readout data D1, it is possible that the frequency of the ramp voltage is set to 30 kHz when the readout data D1 is "0" and the frequency of the ramp voltage is set to 100 kHz when the readout data D1 is "1." As above, it becomes possible to cause the single semiconductor device 1 to operate as an IC for a power supply in which a switching frequency is relatively low or operate as an IC for a power supply in which the switching frequency is relatively high by using the non-volatile memory unit 10 with high reliability.

Furthermore, for example, in an IC for a power supply with a built-in feedback resistor (equivalent to a device obtained by incorporating the feedback resistors 413 and 414 in the semiconductor device 1A in FIG. 16), generally a ratio between the output voltage Vout and the feedback voltage Vfb is fixed. As a result, the target voltage which the output voltage Vout should follow is also fixed. However, it is also possible to apply the configuration of the present embodiment to such an IC for a power supply with a built-in feedback resistor. For example, when focus is made only on the readout data D1, it is possible that the target voltage is set to 3.0 V when the readout data D1 is "0" and the target voltage is set to 5.0 V when the readout data D1 is "1" (in the case of the example of FIG. 14, the respective resistance values of the voltage dividing resistors 311 to 316 may be set in such a manner that such a target voltage is implemented). As above, it becomes possible to cause the single semiconductor device 1 to operate as an IC for a power supply in which the target voltage is relatively low or operate as an IC for a power supply in which the target voltage is relatively high by using the non-volatile memory unit 10 with high reliability.

Fifth Embodiment

The fifth embodiment of the present disclosure will be described. In the fifth embodiment, several applied techniques and modified techniques that can be applied to the above-described first to fourth embodiments will be described.

The configuration has been cited in which the bias current $I_{BIAS}$ can be switched among the current in the normal mode ("I1+I2" in the example of FIG. 4 to FIG. 6) and the two currents in the test mode ("I1" and "I1+I2+I3" in the example of FIG. 4 to FIG. 6). However, the number of stages of switching of the bias current $I_{BIAS}$ may be any number as long as the number is equal to or larger than 3. Therefore, the number of stages of switching of each of the currents $I_{CP1}$ to $I_{CP4}$ may also be any number as long as the number is equal to or larger than 3.

The number of bits of data stored in the non-volatile memory unit 10 (100, 200) (i.e., value of the above-described n) may be other than 4 and therefore may be 1, 2, 3, or 5 or larger. It suffices that fuse elements in a number corresponding to the number of necessary bits are disposed in the non-volatile memory unit 10. In the case in which "n=1" is set in the configuration FIG. 8, the current paths CP2 to CP4, the fuse elements F2 to F4, the transistors M112 to M114 and M262 to M264, and the AND circuits 142 to 144 are unnecessary.

The kinds of channels of the FETs represented in the respective embodiments are exemplification, and the configuration of the circuit including the FETs can be modified in such a manner that N-channel FETs are changed to P-channel FETs or P-channel FETs are changed to N-channel FETs.

As long as an inconvenience is not caused, the above-described transistor may be any kind of transistor. For example, it is also possible to replace the transistor described above as a MOSFET by a junction FET, insulated gate bipolar transistor (IGBT), or bipolar transistor as long as an inconvenience is not caused.

Consideration of Present Disclosure

Consideration will be made regarding a semiconductor device W according to the present disclosure embodied in the above-described respective embodiments.

The semiconductor device W according to one example of the present disclosure is a semiconductor device including a non-volatile memory unit (10, 100, 200) that has a subject current path (for example, CP1) disposed in a semiconductor integrated circuit and a fuse element (for example, F1) inserted in series on the subject current path and changes output data according to a voltage between both ends of the fuse element when supply of a subject current (current in proportion to $I_{BIAS}$) to the subject current path is intended. The semiconductor device W is characterized in that a current supply part that switches the subject current between a plurality of stages is disposed in the non-volatile memory unit.

In the configuration of FIG. 4, the current supply part in the semiconductor device W includes the current mirror circuit 110 and the variable current source 120 and can further include the switch control part 130.

In the configuration of FIG. 8, the current supply part in the semiconductor device W includes the current mirror circuit 210, the variable resistance part 220, the bias voltage supply part 250, and the transistors M260 to M264 and can further include the switch control part 230.

For example, it is preferable for the semiconductor device W to have the following configuration. The semiconductor device is capable of operation in a test mode or a normal mode. A functional circuit unit (30) that carries out operation according to the output data in the normal mode is disposed in the semiconductor device. The current supply part sets a value of the subject current to a reference current value (corresponding to a current in proportion to "I1+I2" or a current in proportion to $I_M$) in the normal mode and sets the value of the subject current with switching between a plurality of test current values in the test mode. The plurality of test current values include a first test current value (corresponding to a current in proportion to I1 or a current in proportion to $I_S$) smaller than the reference current value and a second test current value (corresponding to a current in proportion to "I1+I2+I3" or a current in proportion to $I_L$) larger than the reference current value.

Embodiments of the present disclosure can be variously changed as appropriate within the range of technical ideas indicated in the scope of claims. The above embodiments are merely examples of embodiments of the present disclosure, and meanings of terms of the present disclosure or the respective constituent elements are not limited to what are described in the above embodiments. Specific numerical values indicated in the above explanatory text are merely exemplification, and naturally they can be changed to various numerical values.

What is claimed is:

1. A semiconductor device, comprising:
   a non-volatile memory unit that includes:
      a subject current path disposed in a semiconductor integrated circuit;
      a fuse element in series on the subject current path, wherein
         the semiconductor device is configured to operate in one of a test mode or a normal mode, and
         the non-volatile memory unit is configured to output data according to a voltage between both ends of the fuse element in a case where supply of a subject current to the subject current path is intended; and
      a current supply part configured to:
         set a value of the subject current to a reference current value in the normal mode; and
         switch the value of the subject current between a plurality of test current values in the test mode, wherein the plurality of test current values includes a first test current value smaller than the reference current value and a second test current value larger than the reference current value; and
   a functional circuit unit configured to execute an operation according to the output data in the normal mode.

2. The semiconductor device according to claim 1, wherein
   the output data includes first test result data in a case where the value of the subject current is set to the first test current value,
   the output data includes second test result data in a case where the value of the subject current is set to the second test current value, and
   the semiconductor device is configured to determine an abnormality in the fuse element based on the first test result data and the second test result data.

3. A memory abnormality determination system, comprising:
   the semiconductor device according to claim 2; and
   a determining device configured to determine whether the abnormality of the fuse element exists based on the first test result data and the second test result data.

4. The memory abnormality determination system according to claim 3, wherein the determining device is further configured to
   determine whether the abnormality of the fuse element exists based on one of a comparison between the first test result data and the second test result data or a comparison between first information corresponding to the first test result data and second information corresponding to the second test result data.

5. The semiconductor device according to claim 2, further comprising a determining circuit configured to determine whether the abnormality of the fuse element exists based on the first test result data and the second test result data.

6. The semiconductor device according to claim 5, wherein the determining circuit is further configured to:
   determine whether the abnormality of the fuse element exists based on one of a comparison between the first test result data and the second test result data or a comparison between first information corresponding to the first test result data and second information corresponding to the second test result data.

7. The semiconductor device according to claim 1, wherein the current supply part includes:
   a variable current source configured to switch a bias current that flows in a predetermined reference current path between a plurality of stages; and
   a current mirror circuit connected to the predetermined reference current path and a target current path, wherein
      the current mirror circuit is configured to cause a current in proportion to the bias current to flow in the subject current path as the subject current, and
      the subject current is switched between the plurality of stages by switching the bias current between the plurality of stages.

8. The semiconductor device according to claim 1, wherein the current supply part includes:
   a reference transistor that is a field effect transistor in series on a predetermined reference current path;
   a fuse-side transistor that is a field effect transistor in series on the subject current path;
   a bias voltage supply part configured to supply a common bias voltage to each gate of the reference transistor and the fuse-side transistor;
   a current mirror circuit that is connected to the predetermined reference current path and a target current path, wherein the current mirror circuit is configured to cause a current in proportion to a bias current that flows in the predetermined reference current path to flow in the subject current path as the subject current; and a variable resistance part disposed between a source of the reference transistor and an electrically-conductive part having a predetermined reference potential, wherein the bias current that flows in the predetermined reference current path is switched between a plurality of stages by switching a resistance value of the variable resistance part between the plurality of stages, to switch the subject current to be supplied to the subject current path between the plurality of stages, and the fuse element is disposed between a source of the fuse-side transistor and the electrically-conductive part.

9. The semiconductor device according to claim 8, wherein a ratio of a channel width of the reference transistor to a channel length of the reference transistor is set identical to a ratio of a channel width of the fuse-side transistor to a channel length of the fuse-side transistor.

10. The semiconductor device according to claim 1, wherein the non-volatile memory unit further includes a plurality of sets of the subject current path and the fuse element; and the non-volatile memory unit is further configured to output the output data of a plurality of bits.

11. A semiconductor device, comprising:
a non-volatile memory unit that includes:
  a subject current path disposed in a semiconductor integrated circuit;
  a fuse element in series on the subject current path, wherein the non-volatile memory unit is configured to output data according to a voltage between both ends of the fuse element in a case where supply of a subject current to the subject current path is intended; and
a current supply part configured to switch the subject current, wherein the current supply part includes:
  a reference transistor that is a field effect transistor in series on a predetermined reference current path;
  a fuse-side transistor that is a field effect transistor in series on the subject current path;
  a bias voltage supply part configured to supply a common bias voltage to each gate of the reference transistor and the fuse-side transistor;
  a current mirror circuit that is connected to the predetermined reference current path and a target current path, wherein the current mirror circuit is configured to cause a current in proportion to a bias current that flows in the predetermined reference current path to flow in the subject current path as the subject current; and
  a variable resistance part disposed between a source of the reference transistor and an electrically-conductive part having a predetermined reference potential, wherein
    the bias current that flows in the predetermined reference current path is switched between a plurality of stages by switching a resistance value of the variable resistance part between the plurality of stages, to switch the subject current to be supplied to the subject current path between the plurality of stages, and
    the fuse element is disposed between a source of the fuse-side transistor and the electrically-conductive part.

* * * * *